(12) United States Patent
Lian et al.

(10) Patent No.: US 12,369,348 B2
(45) Date of Patent: *Jul. 22, 2025

(54) FIN FIELD-EFFECT TRANSISTOR DEVICE AND METHOD OF FORMING THE SAME

(71) Applicant: Taiwan Semiconductor Manufacturing Co., Ltd., Hsinchu (TW)

(72) Inventors: Jian-Jou Lian, Tainan (TW); Chun-Neng Lin, Hsinchu (TW); Chieh-Wei Chen, Taoyuan (TW); Tzu-Ang Chiang, I-lan (TW); Ming-Hsi Yeh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/630,549

(22) Filed: Apr. 9, 2024

(65) Prior Publication Data

US 2024/0258428 A1  Aug. 1, 2024

Related U.S. Application Data

(60) Continuation of application No. 17/814,865, filed on Jul. 26, 2022, now Pat. No. 11,978,801, which is a
(Continued)

(51) Int. Cl.
*H10D 30/62*  (2025.01)
*H10D 30/01*  (2025.01)
(Continued)

(52) U.S. Cl.
CPC ........... *H10D 30/62* (2025.01); *H10D 30/024* (2025.01); *H10D 64/017* (2025.01);
(Continued)

(58) Field of Classification Search
None
See application file for complete search history.

(56) References Cited

U.S. PATENT DOCUMENTS 8,436,404 B2   5/2013   Bohr et al.
8,487,378 B2   7/2013   Goto et al.
(Continued)

FOREIGN PATENT DOCUMENTS

CN   102104061 A   6/2011
CN   104009003 A   8/2014
(Continued)

*Primary Examiner* — Nishath Yasmeen
(74) *Attorney, Agent, or Firm* — Slater Matsil, LLP

(57) ABSTRACT

A method of forming a semiconductor device includes surrounding a dummy gate disposed over a fin with a dielectric material; forming a gate trench in the dielectric material by removing the dummy gate and by removing upper portions of a first gate spacer disposed along sidewalls of the dummy gate, the gate trench comprising a lower trench between remaining lower portions of the first gate spacer and comprising an upper trench above the lower trench; forming a gate dielectric layer, a work function layer and a glue layer successively in the gate trench; removing the glue layer and the work function layer from the upper trench; filling the gate trench with a gate electrode material after the removing; and removing the gate electrode material from the upper trench, remaining portions of the gate electrode material forming a gate electrode.

20 Claims, 21 Drawing Sheets

Related U.S. Application Data division of application No. 16/657,480, filed on Oct. 18, 2019, now Pat. No. 11,522,083.

(51) Int. Cl.
*H10D 64/01* (2025.01)
*H10D 84/01* (2025.01)
*H10D 84/03* (2025.01)
*H10D 84/85* (2025.01)

(52) U.S. Cl.
CPC ..... *H10D 84/0184* (2025.01); *H10D 84/0193* (2025.01); *H10D 84/038* (2025.01); *H10D 84/853* (2025.01)

(56) References Cited

U.S. PATENT DOCUMENTS

| | | |
|---|---|---|
| 8,729,634 B2 | 5/2014 | Shen et al. |
| 8,826,213 B1 | 9/2014 | Ho et al. |
| 8,835,244 B2 | 9/2014 | Xie et al. |
| 8,887,106 B2 | 11/2014 | Ho et al. |
| 9,431,505 B2 | 8/2016 | Lim et al. |
| 10,043,803 B2 | 8/2018 | Chung et al. |
| 10,361,200 B1 | 7/2019 | Xu et al. |
| 10,411,113 B2 | 9/2019 | Wu et al. |
| 11,443,984 B2 | 9/2022 | Chen et al. |
| 2011/0147858 A1 | 6/2011 | Lim et al. |
| 2014/0231885 A1 | 8/2014 | Xie et al. |
| 2014/0282326 A1 | 9/2014 | Chen et al. |
| 2015/0021672 A1* | 1/2015 | Chuang ............... H10D 64/017 257/288 |
| 2015/0041905 A1 | 2/2015 | Xie et al. |
| 2015/0311206 A1 | 10/2015 | Hong et al. |
| 2016/0240624 A1 | 8/2016 | Zhu |
| 2017/0077257 A1* | 3/2017 | Hung ................... H10D 64/518 |
| 2017/0170067 A1* | 6/2017 | Yeh ..................... H10D 64/017 |
| 2017/0186746 A1 | 6/2017 | Chung et al. |
| 2017/0186849 A1 | 6/2017 | Chen et al. |

FOREIGN PATENT DOCUMENTS

| | | |
|---|---|---|
| CN | 107017297 A | 8/2017 |
| KR | 20110073214 A | 6/2011 |
| KR | 101595932 B1 | 2/2016 |
| KR | 20170078514 A | 7/2017 |

* cited by examiner

FIN FIELD-EFFECT TRANSISTOR DEVICE AND METHOD OF FORMING THE SAME

PRIORITY CLAIM AND CROSS-REFERENCE

This application is a continuation of U.S. patent application Ser. No. 17/814,865, filed on Jul. 26, 2022 and entitled "Fin Field-Effect Transistor Device and Method of Forming the Same," which is a divisional of U.S. patent application Ser. No. 16/657,480, filed on Oct. 18, 2019 and entitled "Fin Field-Effect Transistor Device and Method of Forming the Same," now U.S. Pat. No. 11,522,083 issued on Dec. 6, 2022, which applications are incorporated herein by reference in their entireties.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
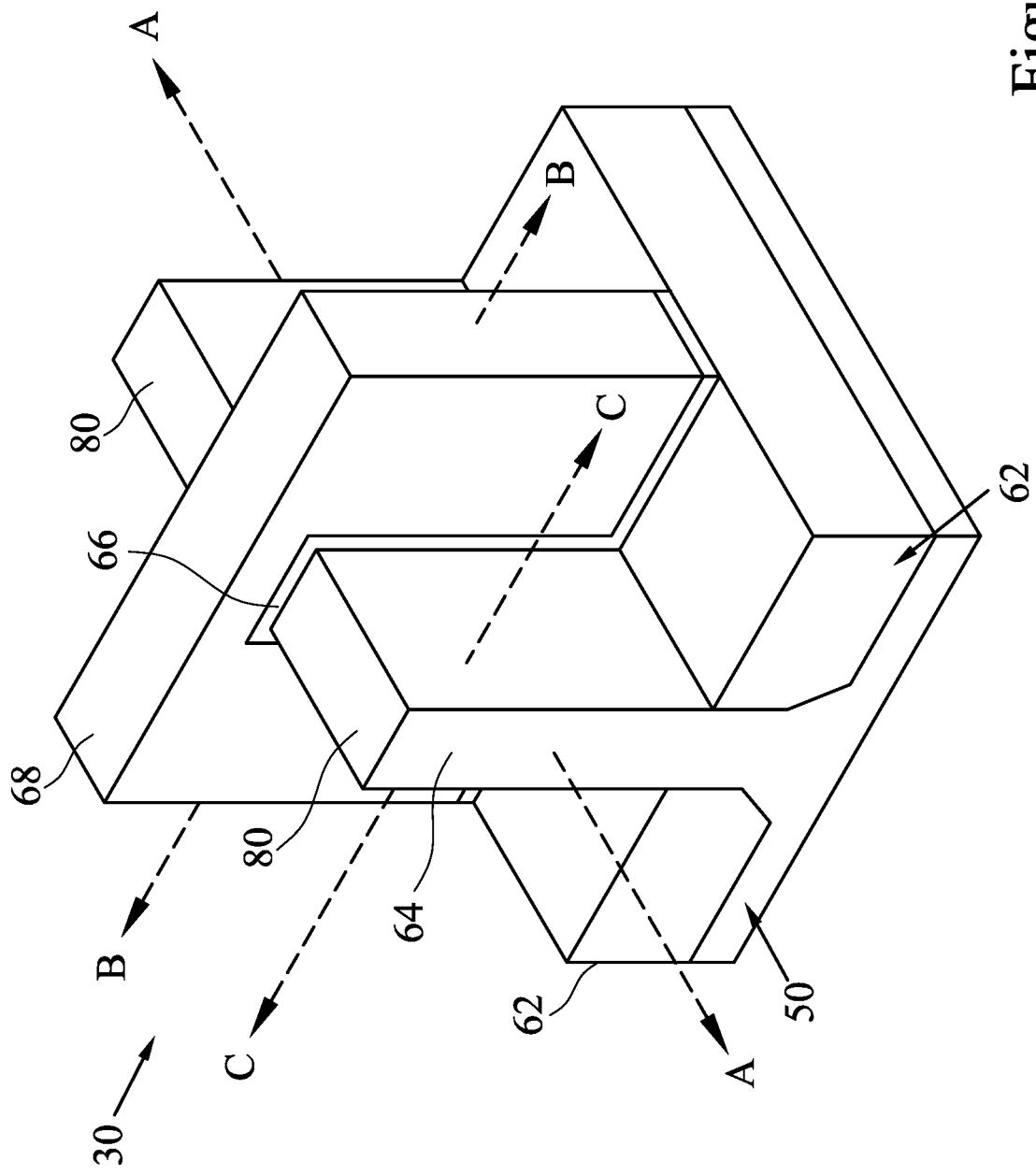
FIG. 1 illustrates a perspective view of a Fin Field-Effect Transistor (FinFET) device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar reference numeral in different figures refers to the same or similar element formed by a same or similar method using a same or similar material(s).

Embodiments of the present disclosure are discussed in the context of forming a FinFET device, and in particular, in the context of forming a replacement gate of a FinFET device. In some embodiments, a dummy gate structure is formed over a fin. A first gate spacer is formed around the dummy gate structure, and a second gate spacer is formed around the first gate spacer. After an interlayer dielectric (ILD) layer is formed around the second gate spacer, the dummy gate structure is removed. Next, upper portions of the first gate spacer are removed while lower portions of the first gate spacer remain. After removing the upper portions of the first gate spacer, a gate trench is formed in the ILD layer, which gate trench has a lower trench between the lower portions of the first gate spacer and has an upper trench over the lower trench, the upper trench being wider than the lower trench. Next, a gate dielectric layer, a work function layer, an optional capping layer, and a glue layer are formed successively in the gate trench. Next, the glue layer is selectively removed from the upper trench by a first wet etch process, the optional capping layer (if formed) is removed from the upper trench by a second wet etch process, and the work function layer is selectively removed from the upper trench by a third wet etch process. After the third wet etch process, remaining portions of the gate dielectric layer, remaining portions of the work function layer, remaining portions of the capping layer, and remaining portions of the glue layer are disposed in the lower trench and have a concave upper surface that is below an interface between the upper trench and the lower trench. Next, the glue layer is formed again (e.g., for a second time) in the gate trench, and a gate metal fills the gate trench. Next, a fourth wet etch process is performed to selectively remove the gate metal from the upper trench, and remaining portions of the gate metal in the lower trench form a gate electrode. After the gate electrode is formed, a fifth wet etch process is performed selectively remove the glue layer from the upper trench. Next, an etching process such as a dry etch is performed to remove the gate dielectric layer from the upper trench.

Metal gates over a fin formed by the above described method have a lager distance (e.g., pitch) in between, thereby reducing metal gate leakage in advanced processing nodes. The various selective etch processes used in the above described method can precisely control the end point of the etching process, avoid damage to the gate dielectric layer, and avoid the loading effect during etch back of the various layers of the metal gates. As a result, the gate height of the metal gate is precisely controlled. In addition, the critical dimension (CD) of the metal gate and the sidewall profiles of the ILD layer and an overlying mask layer are preserved.

FIG. 1 illustrates an example of a FinFET 30 in a perspective view. The FinFET 30 includes a substrate 50 and a fin 64 protruding above the substrate 50. Isolation regions 62 are formed on opposing sides of the fin 64, with the fin 64 protruding above the isolation regions 62. A gate dielectric 66 is along sidewalls and over a top surface of the fin 64, and a gate 68 is over the gate dielectric 66. Source/drain regions 80 are in the fin 64 and on opposing sides of the gate dielectric 66 and the gate 68. FIG. 1 further illustrates reference cross-sections that are used in subsequent figures. Cross-section B-B extends along a longitudinal axis of the gate 68 of the FinFET 30. Cross-section A-A is perpendicular to cross-section B-B and is along a longitudinal axis of the fin 64 and in a direction of, for example, a current flow between the source/drain regions 80. Cross-section C-C is parallel to cross-section B-B and is across the source/drain region 80. Subsequent figures refer to these reference cross-sections for clarity.

Figure 6:
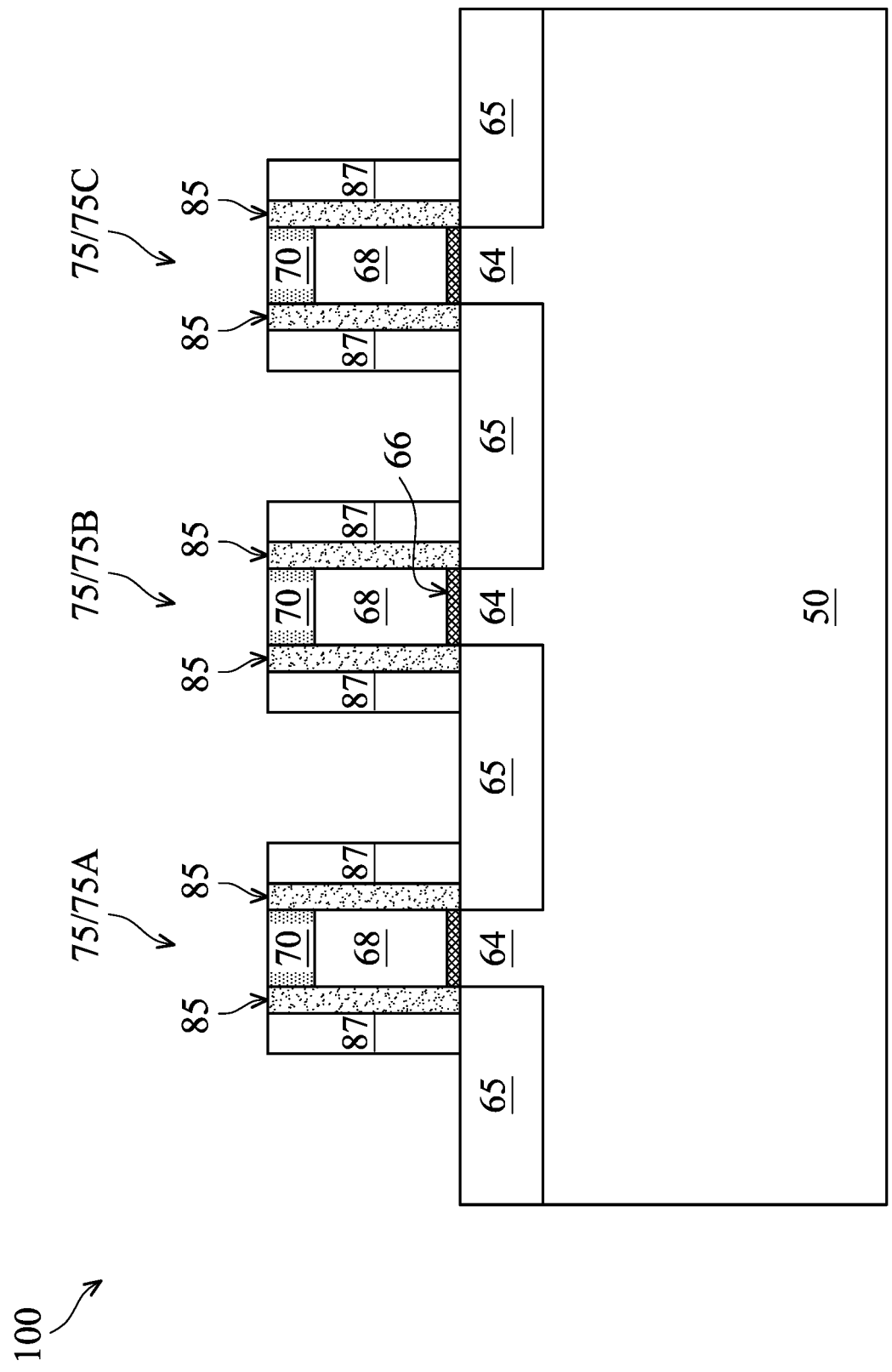
Figure 7A:
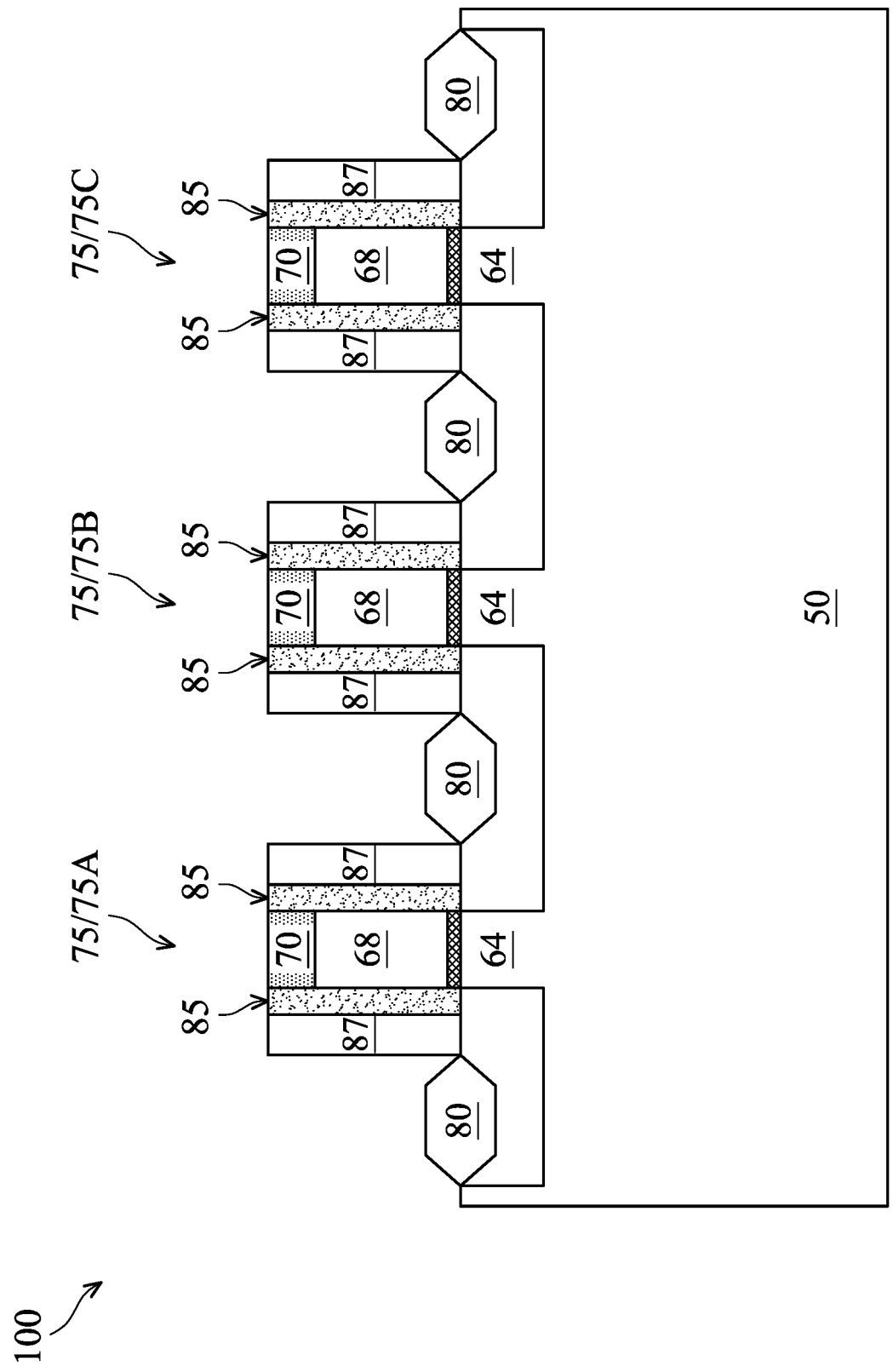
Figure 7B:
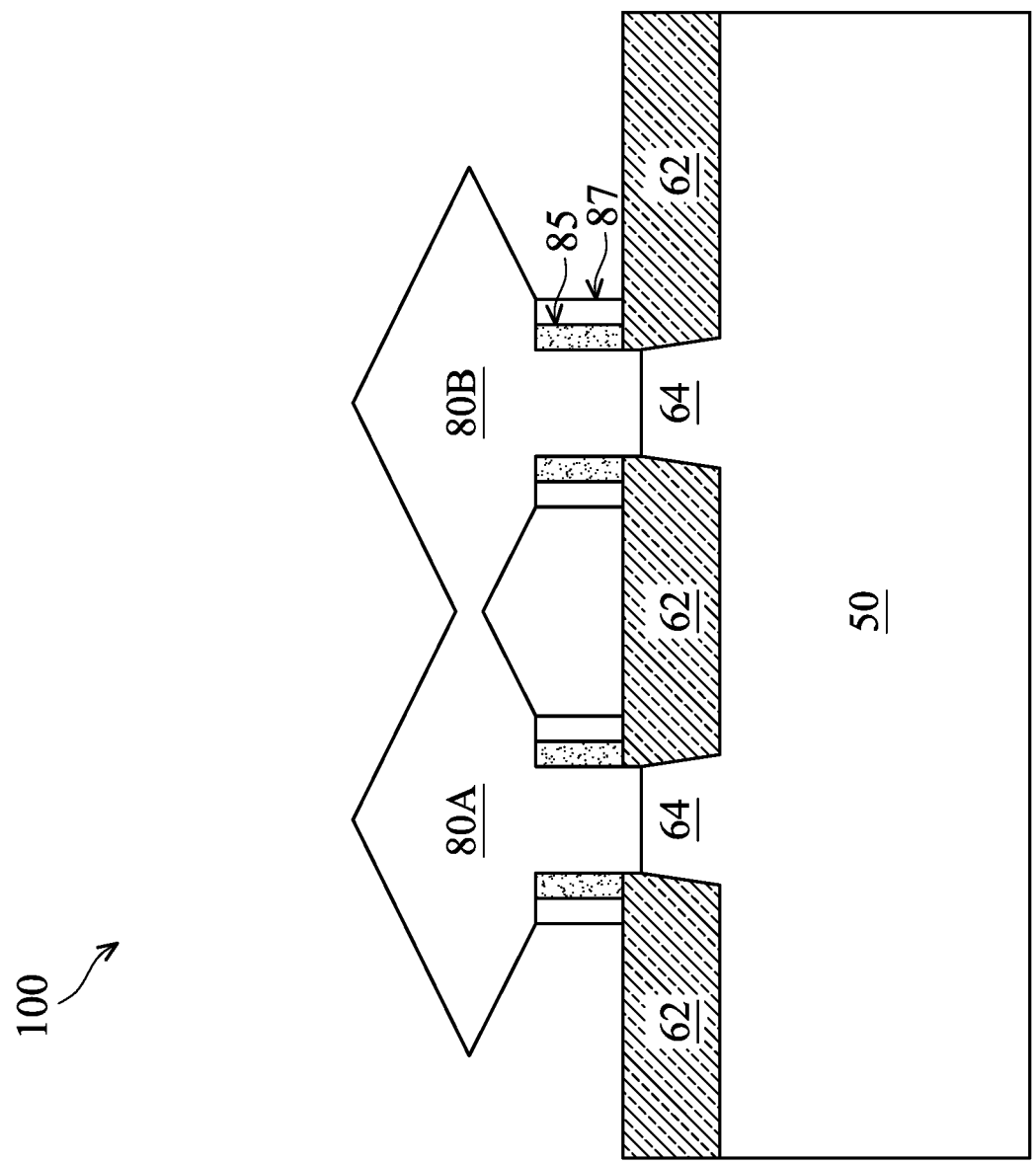
Figure 7C:
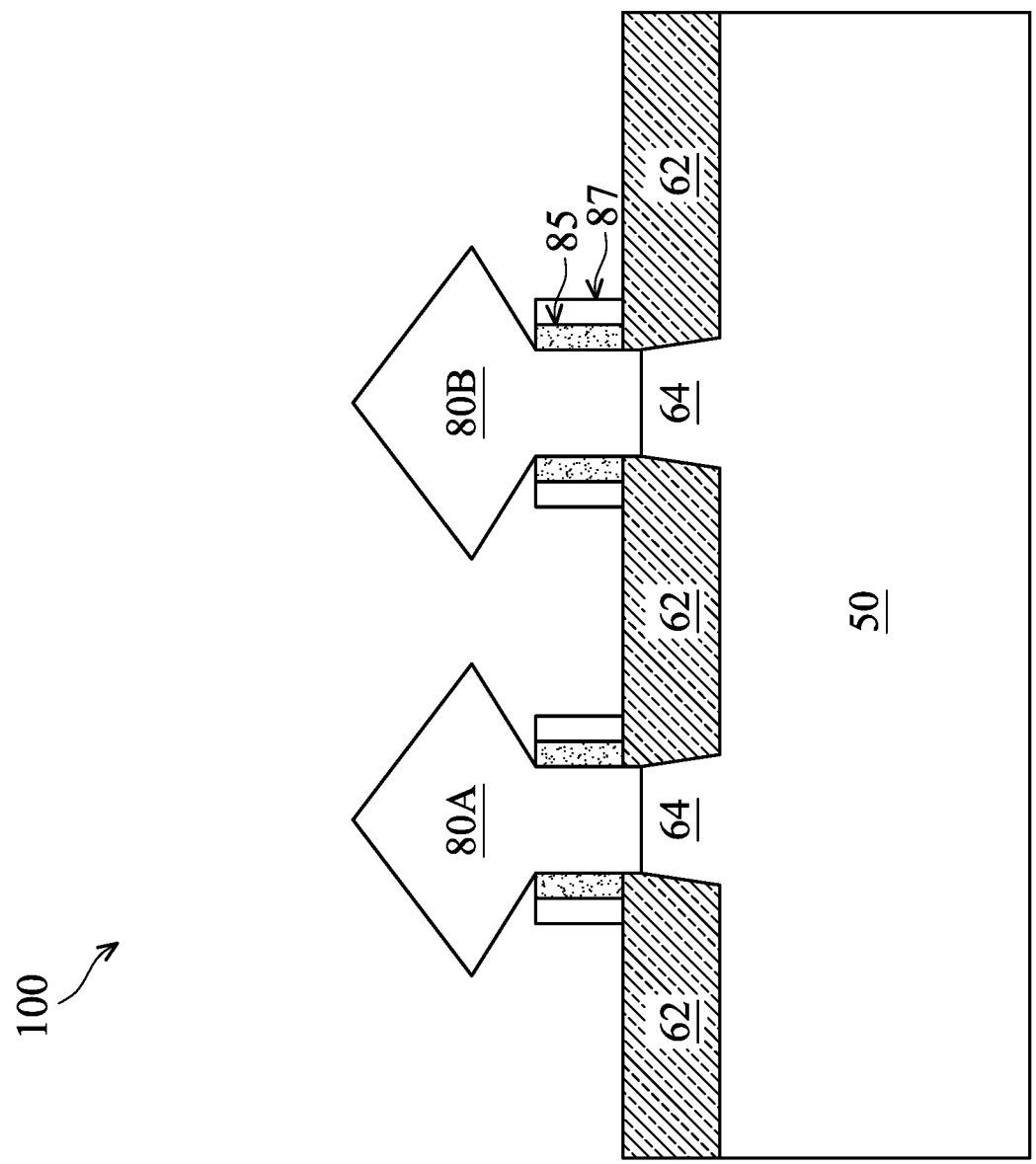

FIGS. 2-6, 7A, 7B, 7C, and 8-21 are cross-sectional views of a FinFET device 100 at various stages of fabrication in accordance with an embodiment. The FinFET device 100 is similar to the FinFET 30 in FIG. 1, but with multiple fins and multiple gate structures. FIGS. 2-5 illustrate cross-sectional views of the FinFET device 100 along cross-section B-B. FIGS. 6, 7A, and 8-21 illustrate cross-sectional views of the FinFET device 100 along cross-section A-A, and FIGS. 7B and 7C illustrate cross-sectional views of the FinFET device 100 along cross-section C-C.

Figure 2:
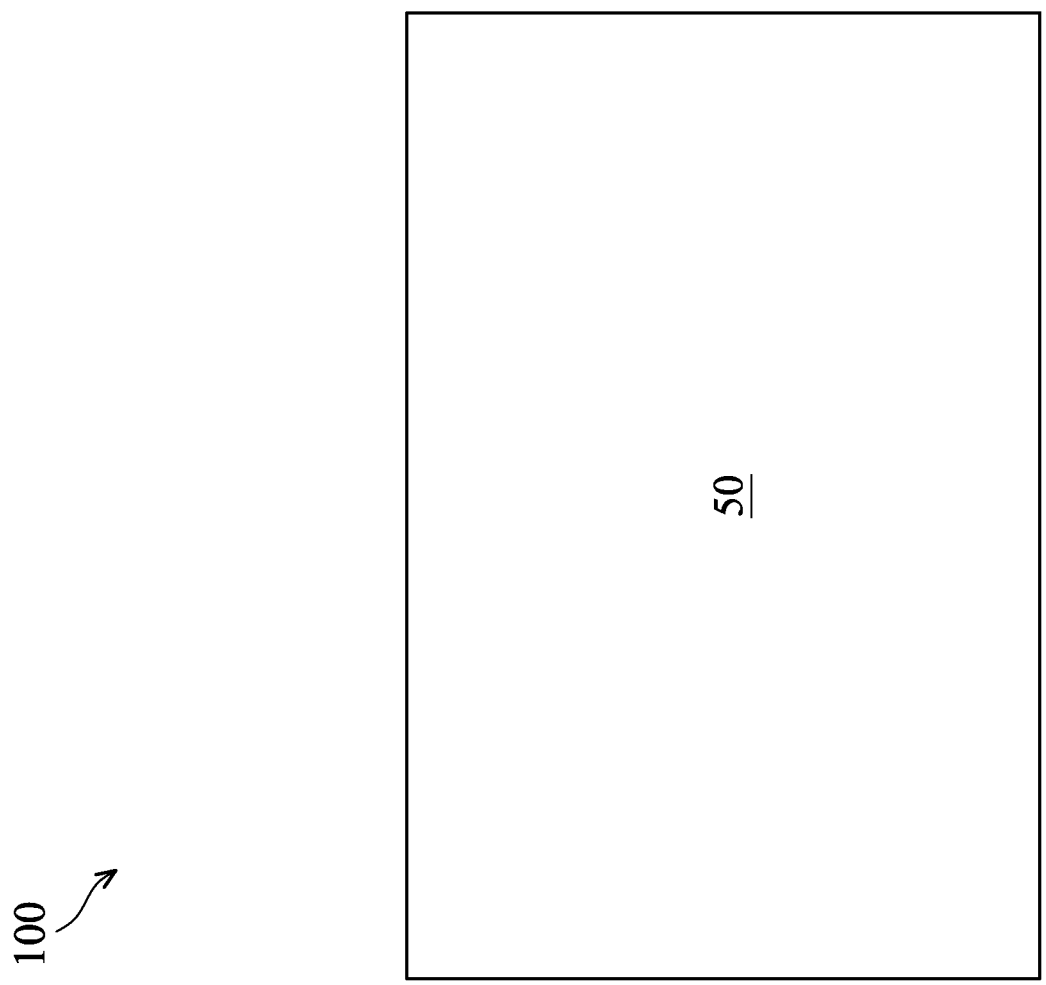
FIGS. 2-6, 7A, 7B, 7C, and 8-21 illustrate cross-sectional views of a FinFET device at various stages of fabrication, in accordance with an embodiment.

FIG. 2 illustrates a cross-sectional view of the substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
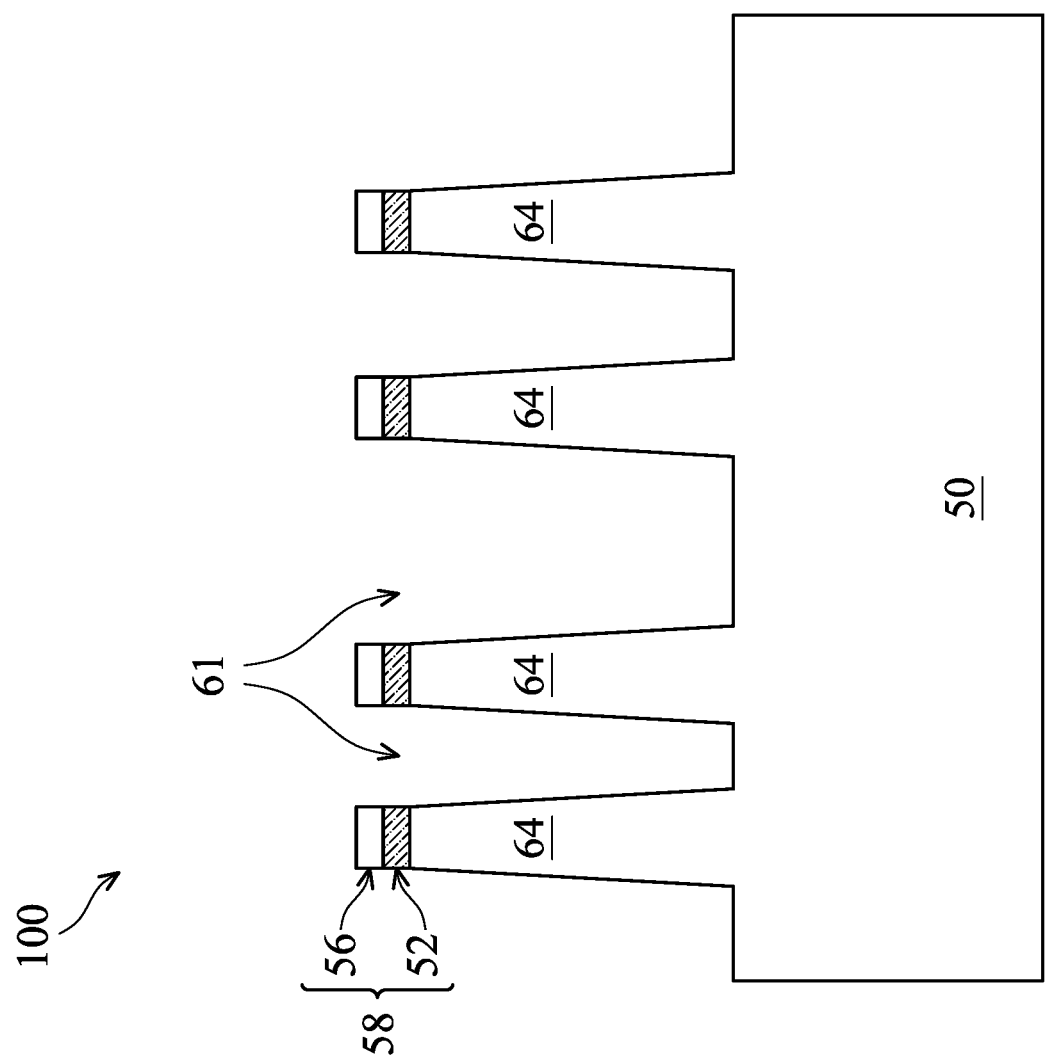

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56. In some embodiments, the pad nitride layer 56 is formed of silicon nitride, silicon oxynitride, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58, as illustrated in FIG. 3.

The patterned mask 58 is subsequently used to pattern exposed portions of the substrate 50 to form trenches 61, thereby defining semiconductor fins 64 between adjacent trenches 61 as illustrated in FIG. 3. In some embodiments, the semiconductor fins 64 are formed by etching trenches in the substrate 50 using, for example, reactive ion etch (RIE), neutral beam etch (NBE), the like, or a combination thereof. The etch may be anisotropic. In some embodiments, the trenches 61 may be strips (viewed from in the top) parallel to each other, and closely spaced with respect to each other. In some embodiments, the trenches 61 may be continuous and surround the semiconductor fins 64. The semiconductor fins 64 may also be referred to as fins 64 hereinafter.

The fins 64 may be patterned by any suitable method. For example, the fins 64 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
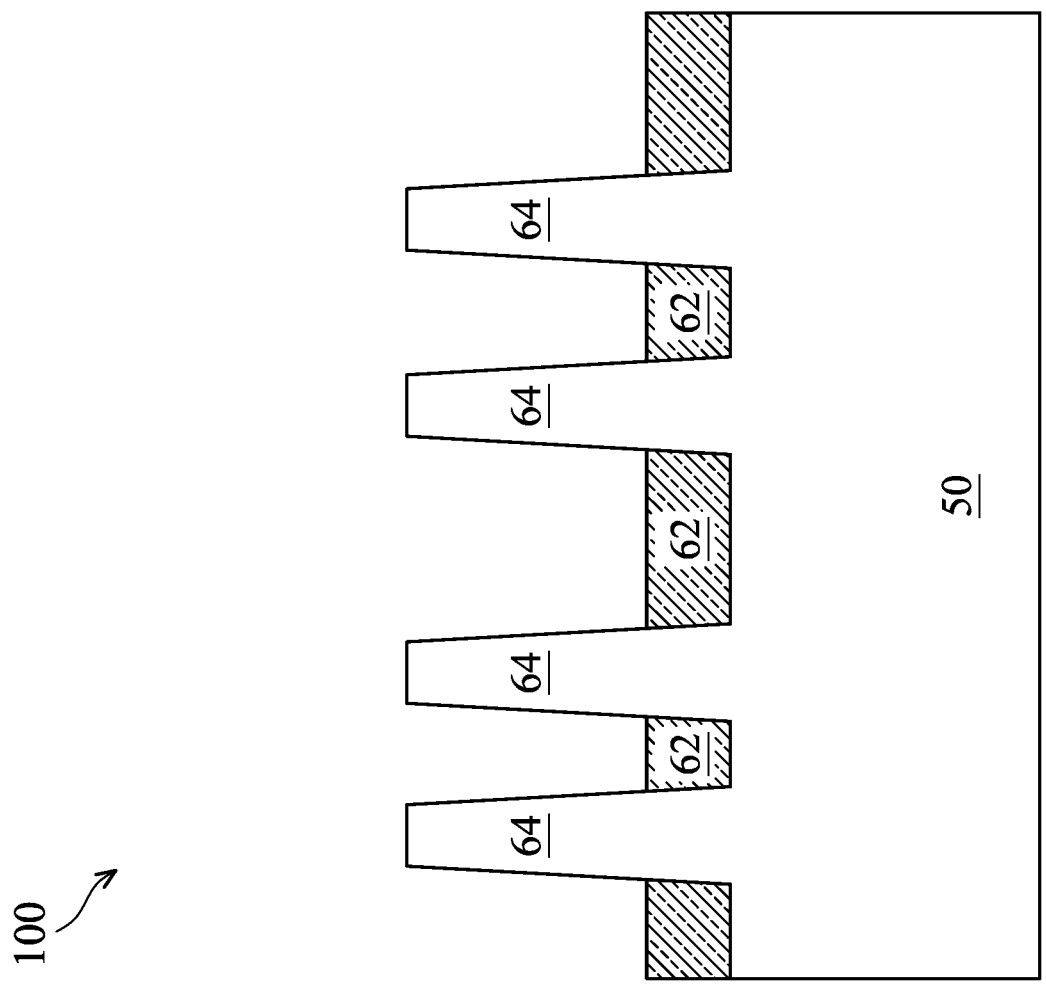

FIG. 4 illustrates the formation of an insulation material between neighboring semiconductor fins 64 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 62 and top surfaces of the semiconductor fins 64 that are coplanar (not shown). The patterned mask 58 (see FIG. 3) may also be removed by the planarization process.

In some embodiments, the isolation regions 62 include a liner, e.g., a liner oxide (not shown), at the interface between the isolation region 62 and the substrate 50/semiconductor fins 64. In some embodiments, the liner oxide is formed to reduce crystalline defects at the interface between the substrate 50 and the isolation region 62. Similarly, the liner oxide may also be used to reduce crystalline defects at the interface between the semiconductor fins 64 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions 62. The isolation regions 62 are recessed such that the upper portions of the semiconductor fins 64 protrude from between neighboring STI regions 62. The top surfaces of the STI regions 62 may have a flat surface (as illustrated), a convex surface, a concave surface (such as dishing), or a combination thereof. The top surfaces of the STI regions 62 may be formed flat, convex, and/or concave by an appropriate etch. The isolation regions 62 may be recessed using an acceptable etching process, such as one that is selective to the material of the isolation regions 62. For example, a dry etch or a wet etch using dilute hydrofluoric (dHF) acid may be performed to recess the isolation regions 62.

FIGS. 2 through 4 illustrate an embodiment of forming fins 64, but fins may be formed in various different processes. For example, a top portion of the substrate 50 may be replaced by a suitable material, such as an epitaxial material suitable for an intended type (e.g., N-type or P-type) of semiconductor devices to be formed. Thereafter, the substrate 50, with epitaxial material on top, is patterned to form semiconductor fins 64 that comprise the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 64 may comprise silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
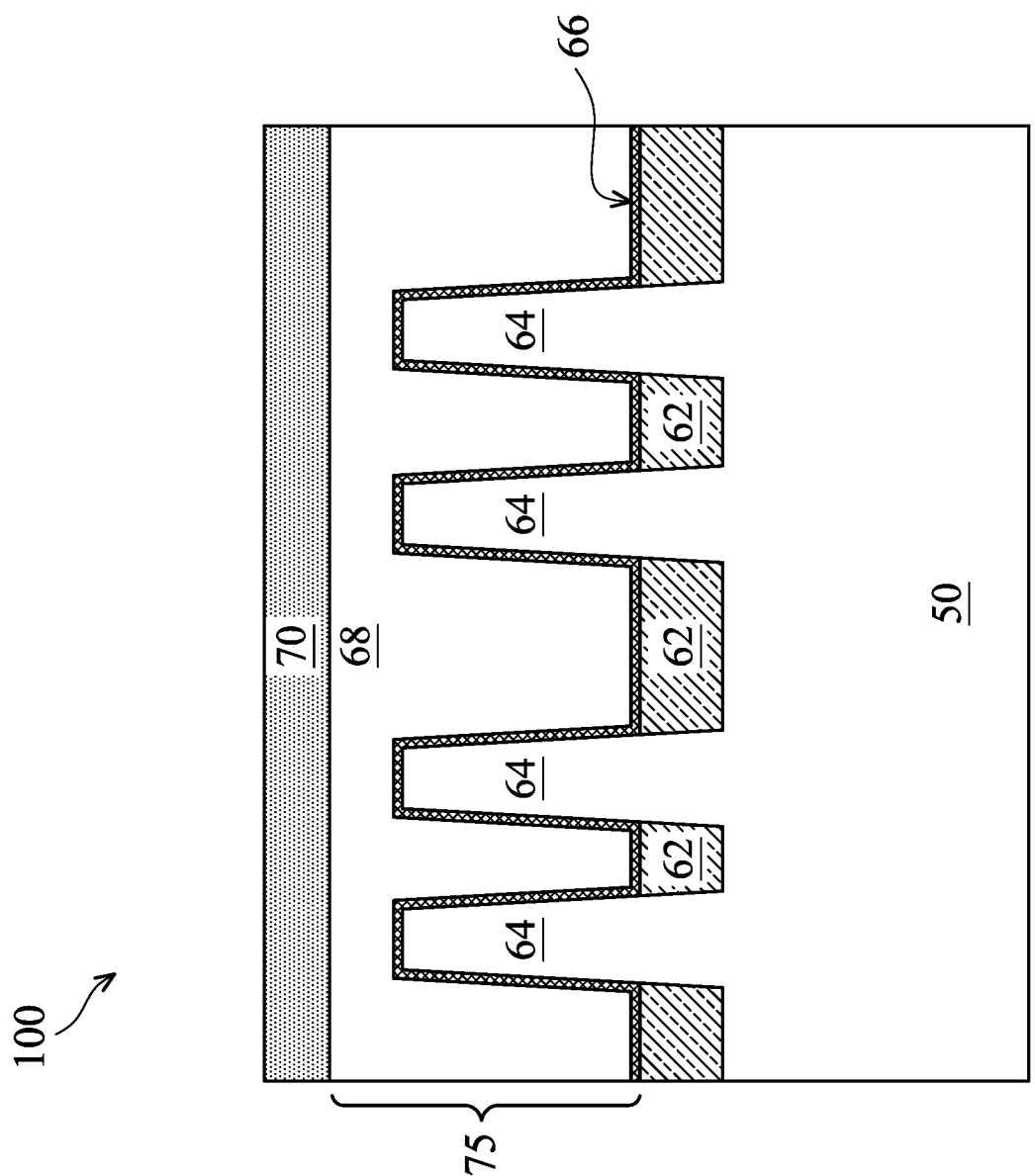

FIG. 5 illustrates the formation of dummy gate structures 75. The dummy gate structure 75 includes gate dielectric 66 and gate 68, in some embodiments. A mask 70 may be formed over the dummy gate structure 75. To form the dummy gate structure 75, a dielectric layer is formed on the semiconductor fins 64. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form mask 70. The pattern of the mask 70 then may be transferred to the gate layer and the dielectric layer by an acceptable etching technique to form gate 68 and gate dielectric 66, respectively. The gate 68 and the gate dielectric 66 cover respective channel regions of the semiconductor fins 64. The gate 68 may also have a lengthwise direction substantially perpendicular to the lengthwise direction of respective semiconductor fins 64.

The gate dielectric 66 is shown to be formed over the fins 64 (e.g., over top surfaces and sidewalls of the fins 64) and over the STI regions 62 in the example of FIG. 5. In other embodiments, the gate dielectric 66 may be formed by, e.g., thermal oxidization of a material of the fins 64, and therefore, may be formed over the fins 64 but not over the STI regions 62. These and other variations are fully intended to be included within the scope of the present disclosure.

Figure 8:
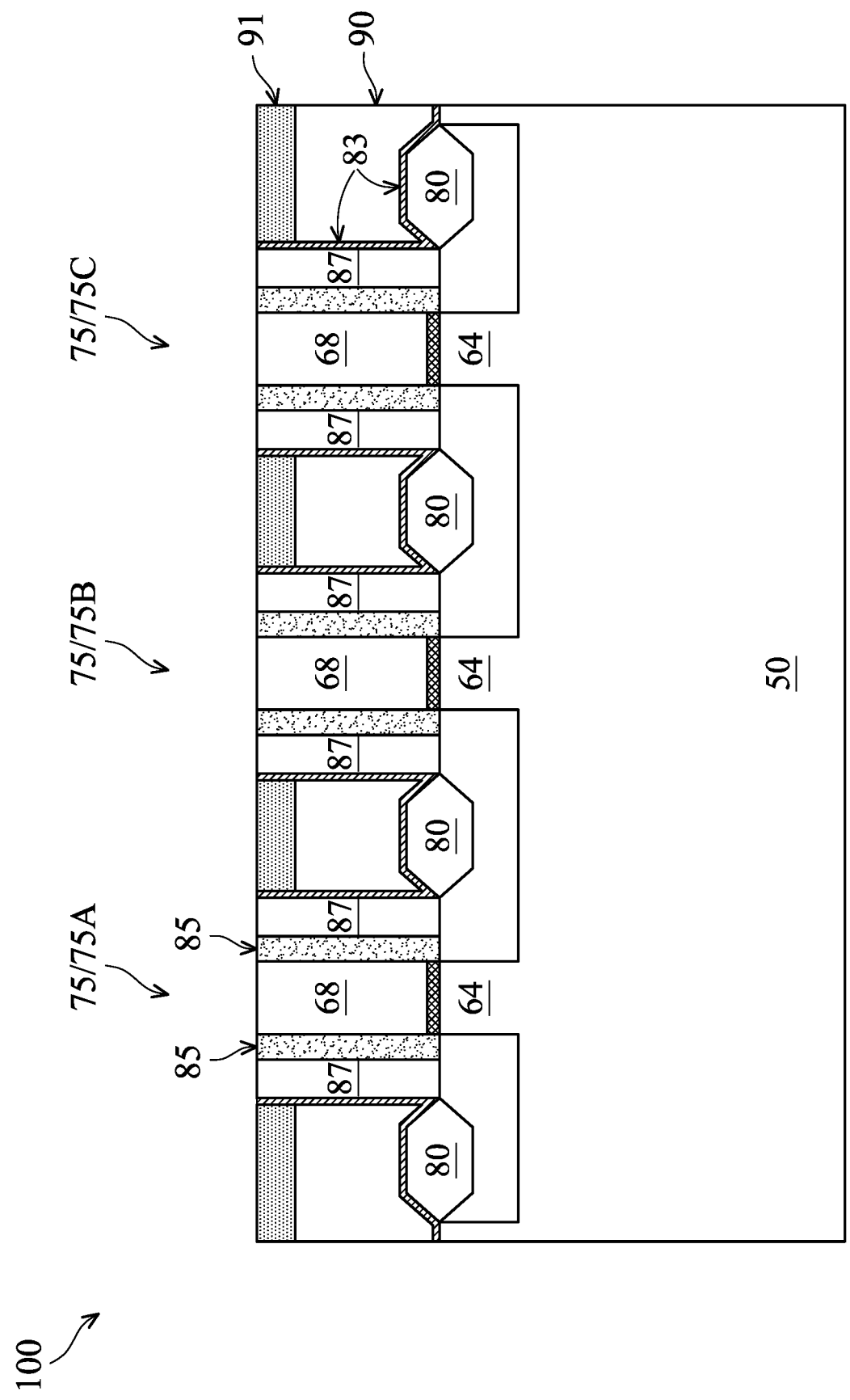

FIGS. 6, 7A, and 8-21 illustrate the cross-sectional views of further processing of the FinFET device 100 along cross-section A-A (along a longitudinal axis of the fin 64). FIGS. 7B and 7C illustrate two embodiment cross-sectional views of the FinFET device 100 at the processing step of FIG. 7A, but along cross-section C-C. In FIGS. 6-8, three dummy gate structures 75A, 75B, and 75C are illustrated over the fin 64. For simplicity, the dummy gate structures 75A, 75B, and 75C may be collectively referred to as dummy gate structures 75. One skilled in the art will appreciate that more or less than three gate structures may be formed over the fin 64, these and other variations are fully intended to be included within the scope of the present disclosure.

As illustrated in FIG. 6, lightly doped drain (LDD) regions 65 are formed in the fins 64. The LDD regions 65 may be formed by a plasma doping process. The plasma doping process may include forming and patterning masks such as a photoresist to cover the regions of the FinFET that are to be protected from the plasma doping process. The plasma doping process may implant N-type or P-type impurities in the fins 64 to form the LDD regions 65. For example, P-type impurities, such as boron, may be implanted in the fin 64 to form the LDD regions 65 for a P-type device. As another example, N-type impurities, such as phosphorus, may be implanted in the fin 64 to form the LDD regions 65 for an N-type device. In some embodiments, the LDD regions 65 abut the channel region of the FinFET device 100. Portions of the LDD regions 65 may extend under gate 68 and into the channel region of the FinFET device 100. FIG. 6 illustrates a non-limiting example of the LDD regions 65. Other configurations, shapes, and formation methods of the LDD regions 65 are also possible and are fully intended to be included within the scope of the present disclosure. For example, LDD regions 65 may be formed after gate spacers 87/85 are formed. In some embodiments, the LDD regions 65 are omitted.

Still referring to FIG. 6, after the LDD regions 65 are formed, first gate spacers 85 are formed around (e.g., along and contacting the sidewalls of) the dummy gate structures 75, and second gate spacers 87 are formed around (e.g., along and contacting the sidewalls of) the first gate spacers 85. For example, the first gate spacer 85 may be formed on opposing sidewalls of the dummy gate structure 75. The second gate spacer 87 is formed on the first gate spacer 85.

The first gate spacer 85 may be a low-k spacer and may be formed of a suitable dielectric material, such as silicon oxide, silicon oxycarbonitride, or the like. The second gate spacer 87 may be formed of a nitride, such as silicon nitride, silicon oxynitride, silicon carbonitride, the like, or a combination thereof. Any suitable deposition method, such as thermal oxidation, chemical vapor deposition (CVD), or the like, may be used to form the first gate spacer 85 and the second gate spacer 87. In the illustrated embodiment, the first gate spacer 85 and the second gate spacer 87 are formed of different materials to provide etching selectivity in subsequent processing. The first gate spacer 85 and the second gate spacer 87 may be collectively referred to as gate spacers 85/87.

The shapes and formation methods of the gate spacers (e.g., 85 and 87) as illustrated in FIG. 6 are merely non-limiting examples, and other shapes and formation methods are possible. These and other variations are fully intended to be included within the scope of the present disclosure.

Next, in FIG. 7A, recesses are formed in the fins 64 adjacent to the dummy gate structures 75, e.g., between adjacent dummy gate structures 75 and/or next to a dummy gate structure 75, and source/drain regions 80 are formed in the recesses. The recesses are formed by, e.g., an anisotropic etching process using the dummy gate structures 75 as an etching mask, in some embodiments, although any other suitable etching process may also be used.

The source/drain regions 80 are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 7A, the epitaxial source/drain regions 80 may have surfaces raised from respective surfaces of the fins 64 (e.g. raised above the non-recessed portions of the fins 64) and may have facets. The source/drain regions 80 of the adjacent fins 64 may merge to form a continuous epitaxial source/drain region 80 (see FIG. 7B). In some embodiments, the source/drain regions 80 for adjacent fins 64 do not merge together and remain separate source/drain regions 80 (see FIG. 7C). In some embodiments, the resulting FinFET is an n-type FinFET, and source/drain regions 80 comprise silicon carbide (SiC), silicon phosphorous (SiP), phosphorous-doped silicon carbon (SiCP), or the like. In some embodiments, the resulting FinFET is a p-type FinFET, and source/drain regions 80 comprise SiGe, and a p-type impurity such as boron or indium.

The epitaxial source/drain regions 80 may be implanted with dopants to form source/drain regions 80 followed by an anneal process. The implanting process may include forming and patterning masks such as a photoresist to cover the regions of the FinFET that are to be protected from the implanting process. The source/drain regions 80 may have an impurity (e.g., dopant) concentration in a range from about 1E19 $cm^{-3}$ to about 1E21 $cm^{-3}$. P-type impurities, such as boron or indium, may be implanted in the source/drain region 80 of a P-type transistor. N-type impurities, such as phosphorous or arsenide, may be implanted in the source/drain regions 80 of an N-type transistor. In some embodiments, the epitaxial source/drain regions may be in situ doped during growth.

Next, as illustrated in FIG. 8, a contact etch stop layer (CESL) 83 is formed over the structure illustrated in FIG. 7A. The CESL 83 functions as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, an interlayer dielectric (ILD) 90 is formed over the CESL 83 and over the dummy gate structures 75 (e.g., 75A, 75B, and 75C). In some embodiments, the ILD 90 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 90 is formed, a dielectric layer 91 is formed over the ILD 90. The dielectric layer 91 functions as a protection layer to prevent or reduces the loss of the ILD 90 in subsequent etching processes. The dielectric layer 91 may be formed of a suitable material, such as silicon nitride, silicon carbonitride, or the like, using a suitable method such as CVD, PECVD, or FCVD. After the dielectric layer 91 is formed, a planarization process, such as a CMP process, may be performed to achieve a level upper surface for the dielectric layer 91. The CMP may also remove the mask 70 and portions of the CESL 83 disposed over the gate 68. After the planarization process, the upper surface of the dielectric layer 91 is level with the upper surface of the gate 68, in some embodiments.

An embodiment gate-last process (sometimes referred to as replacement gate process) is performed subsequently to replace the gate 68 and the gate dielectric 66 of the dummy gate structure 75 with an active gate (may also be referred to as a replacement gate or a metal gate).

Figure 9:
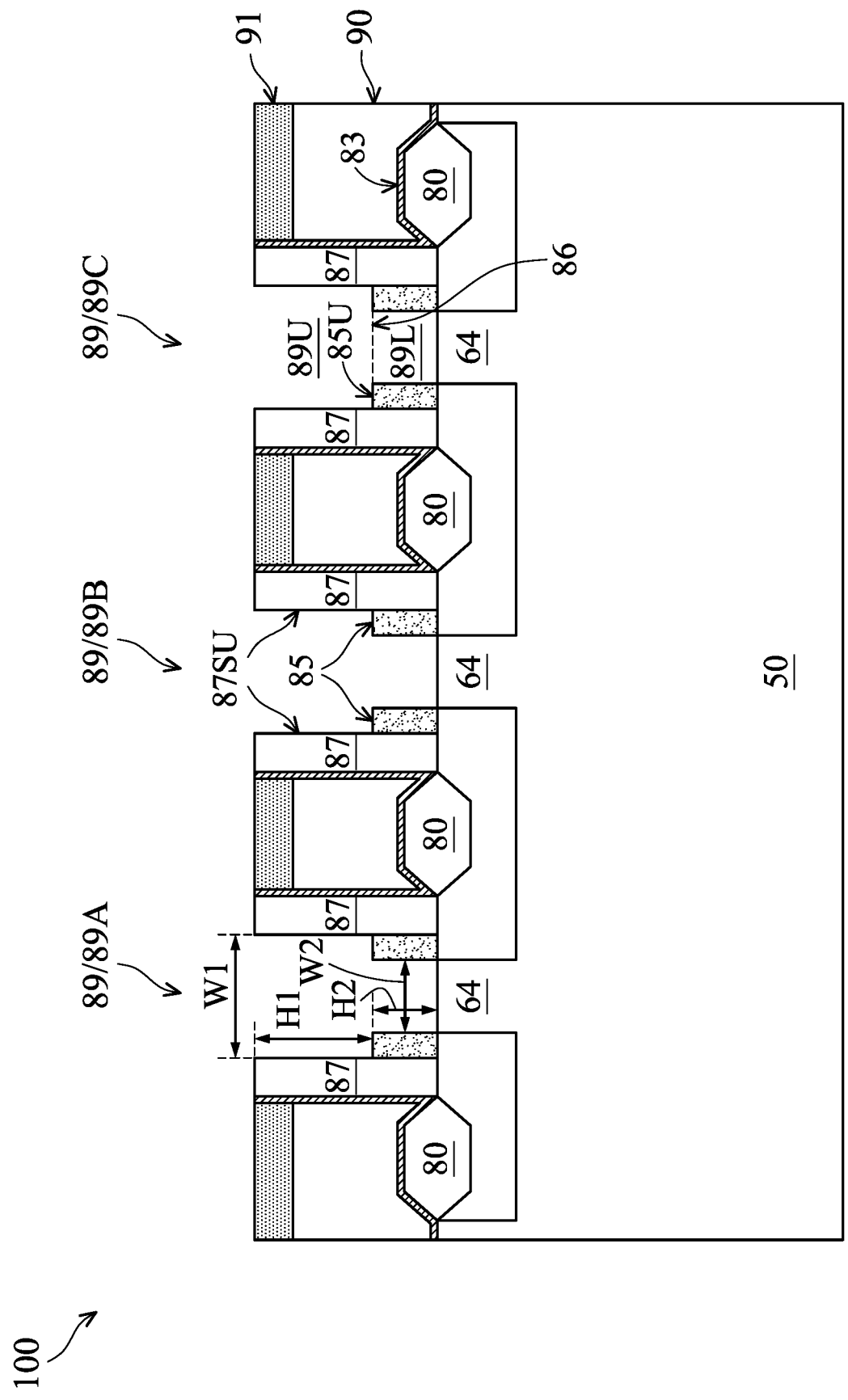

Next, in FIG. 9, the dummy gate structures 75A, 75B, and 75C (see FIG. 7A) are removed to form gate trenches 89A, 89B, and 89C, respectively. Next, upper portions of the gate trenches 89A, 89B, and 89C are expanded by removing upper portions of the first gate spacers 85, such that each of the gate trenches 89A, 89B, and 89C has an upper trench 89U and a lower trench 89L, where the upper trench 89U is wider than the lower trench 89L. Details of forming the gate trenches 89A, 89B, and 89C are discussed hereinafter. For simplicity, the gate trenches 89A, 89B, and 89C may be collectively referred to as gate trenches 89.

In some embodiments, to remove the dummy gate structures 75, one or more etching steps are performed to remove the gate 68 and the gate dielectric 66 directly under the gate 68, so that the gate trenches 89 (may also be referred to as recesses) are formed between respective first gate spacers 85. Each gate trench 89 exposes the channel region of a respective fin 64. During the dummy gate removal, the gate dielectric 66 may be used as an etch stop layer when the gate 68 is etched. The gate dielectric 66 may then be removed after the removal of the gate 68.

Next, an anisotropic etching process, such as a dry etch process, is performed to remove upper portions of the first gate spacer 85. In some embodiments, the anisotropic etching process is performed using an etchant that is selective to (e.g., having a higher etching rate for) the material of the first gate spacer 85, such that the first gate spacer 85 is recessed (e.g., upper portions removed) without substantially attacking the second gate spacer 87 and the dielectric layer 91. After the upper portions of the first gate spacers 85 are removed, upper sidewalls 87SU of the second gate spacer 87 are exposed.

As illustrated in FIG. 9, after the upper portions of the first gate spacers 85 are removed, each of the gate trenches 89 has an upper trench 89U and a lower trench 89L. The lower trench 89L is between the remaining lower portions of the first gate spacer 85. The upper trench 89U is over the lower trench, and is defined (e.g., bordered) by the upper sidewalls 87SU of the second gate spacer 87. FIG. 9 illustrates an interface 86 between the upper trench 89U and the lower trench 89L, which interface 86 is level with the upper surface 85U of the remaining lower portions of the first gate spacer 85. Each of the gate trenches 89 has a wider upper trench 89U and a narrow lower trench 89L, which resembles the letter "Y," and therefore, the gate trenches 89 may be referred to as Y-shaped gate trenches.

In some embodiments, the upper trench 89U has a width W1 (e.g., a distance between respective opposing upper sidewalls 87SU) between about 20 nm and about 30 nm, and has a depth H1 (e.g., a distance between the upper surface of the second gate spacer 87 and the interface 86) between about 40 nm and about 80 nm. The lower trench 89L has a width W2 (e.g., a distance between respective opposing sidewalls of the remaining lower portions of the first gate spacer 85) between about 10 nm and about 20 nm, and has a depth H2 (e.g., a distance between the bottom of the gate trench 89 and the interface 86) between about 20 nm and about 40 nm. As will be described in subsequent processing, metal gates 97 (see, e.g., FIG. 21) are formed in the lower trenches 89L. For example, a gate electrode material (see, e.g., 101 in FIG. 21), such as tungsten, is used to fill the lower trenches 89L to form the gate electrode of the metal gates. Therefore, the size of the lower trench 89L determines the size of the metal gates and the size of the gate electrodes.

Figure 10:
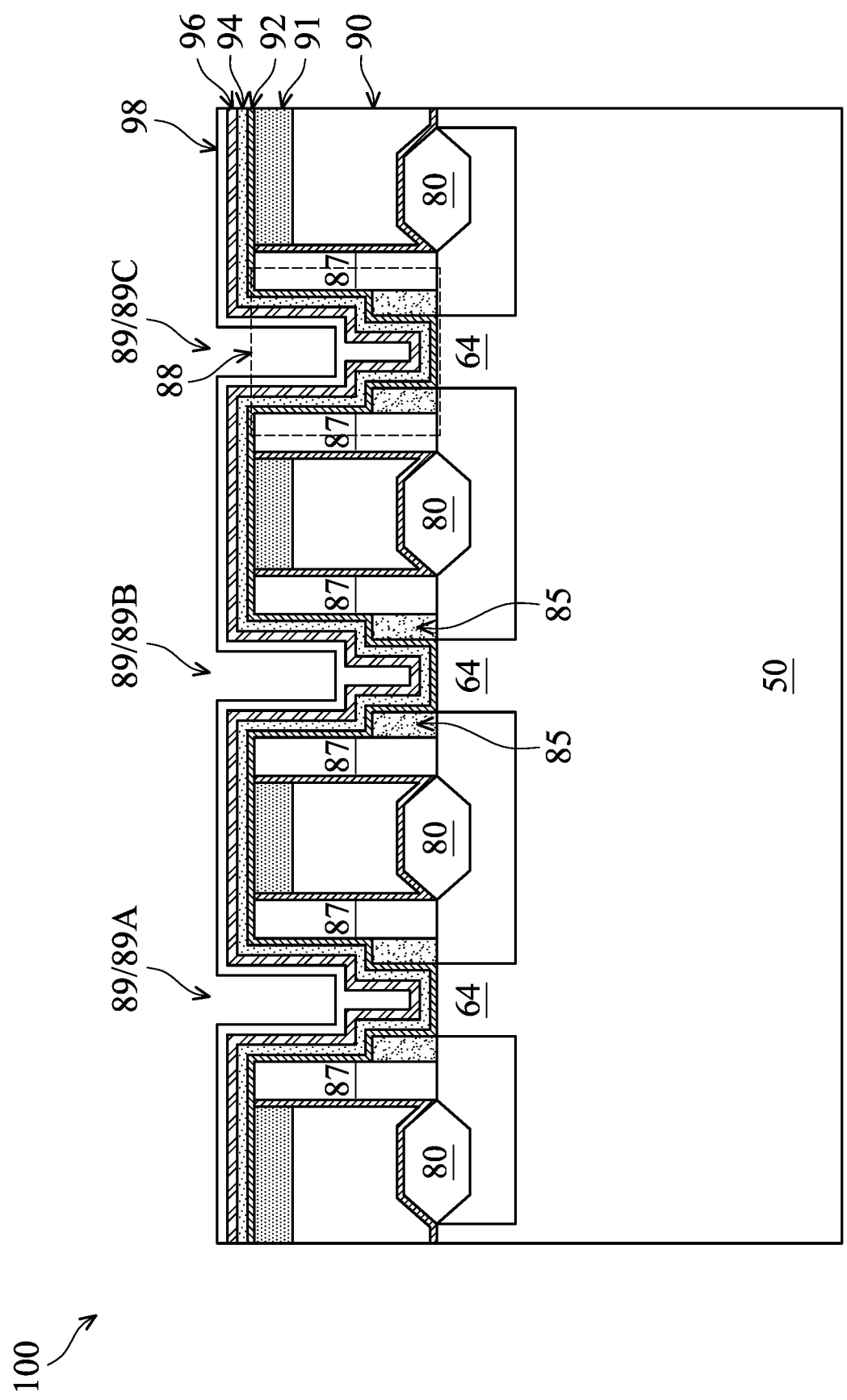

Next, in FIG. 10, a gate dielectric layer 92, a work function layer 94, an optional capping layer 96, and a glue layer 98 are formed successively in the gate trenches 89. The gate dielectric layer 92 is deposited conformally in the gate trenches 89, such as on the top surfaces and the sidewalls of the fins 64, on the top surfaces and the sidewalls of the gate spacers 85/87, and on the top surface of the dielectric layer 91. In accordance with some embodiments, the gate dielectric layer 92 comprises silicon oxide, silicon nitride, or multilayers thereof. In example embodiments, the gate dielectric layer 92 includes a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of gate dielectric layer 92 may include molecular beam deposition (MBD), atomic layer deposition (ALD), PECVD, and the like. A thickness of the gate dielectric layer 92 may be between about 8 angstroms and about 20 angstroms, as an example. In some embodiments, an interfacial layer (IL) is formed in the gate trenches 89 before the gate dielectric layer 92 is formed.

Next, the work function layers 94 is formed (e.g., conformally) over the gate dielectric layer 92. The work function layer 94 may be a P-type work function layer, an N-type work function layer, multi-layers thereof, or combinations thereof, in some embodiments. In the illustrated example of FIG. 10, the work function layer 94 is an N-type work function layer. In the discussion herein, a work function layer may also be referred to as a work function metal. Exemplary P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Exemplary N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), ALD, and/or other suitable process. A thickness of a P-type work function layer may be between about 8 angstroms and about 15 angstroms, and a thickness of an N-type work function layer may be between about 15 angstroms and about 30 angstroms, as examples.

Next, the capping layer 96, which is optional, is formed (e.g., conformally) over the work function layer 94. The capping layer 96, if formed, protects the underlying work function layer 94 from being oxidized. In some embodiments, the capping layer 96 is a silicon-containing layer, such as a layer of silicon, a layer of silicon oxide, or a layer of silicon nitride formed by a suitable method such as ALD, MBD, CVD, or the like. A thickness of the capping layer 96 may be between about 8 angstroms and about 15 angstroms. In some embodiments, the capping layer 96 is omitted.

Next, the glue layer 98 is formed (e.g., conformally) over the capping layer 96, or over the work function layer 94 if the capping layer 96 is omitted. The glue layer 98 functions as an adhesion layer between the underlying layer (e.g., 96) and a subsequently formed gate electrode material over the glue layer 98. The glue layer 98 may be formed of a suitable material, such as titanium nitride, using a suitable deposition method such as CVD, PVD, ALD, or the like. Depending on the width W2 of the lower trench 89L and the thicknesses of the previously formed layers (e.g., 92, 94, 96) in the gate trenches, the glue layer 98 may fill the remaining portions of the lower trench 89L, as illustrated in the example of FIG. 10.

Figure 11:
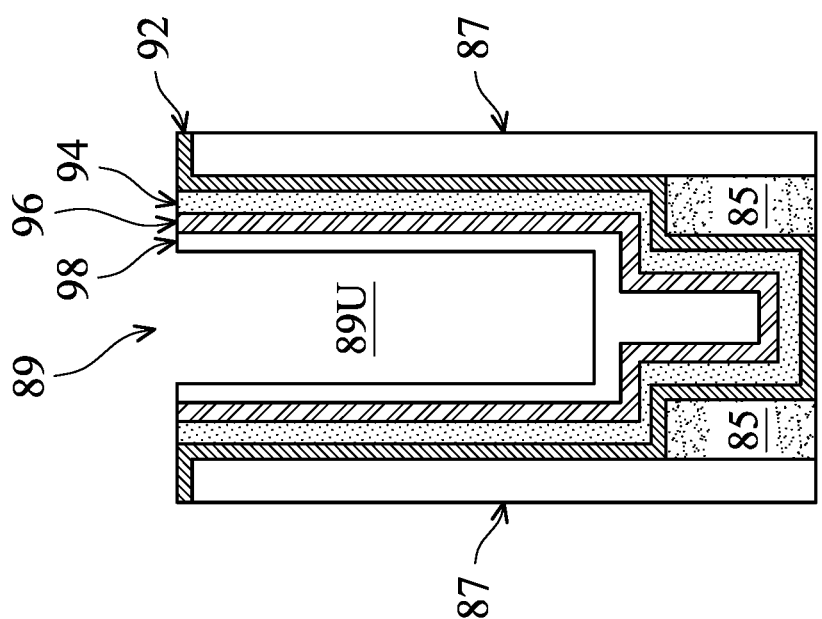

FIGS. 11-20 illustrate additional processing steps to form the metal gates of the FinFET device 100. For simplicity, FIGS. 11-20 each illustrates only a portion of the FinFET device 100. In particular, FIGS. 11-20 each illustrates a zoomed-in view of a region 88 in FIG. 10. For example, FIG. 11 shows the region 88 of FIG. 10 after the glue layer 98 is formed.

Figure 12:
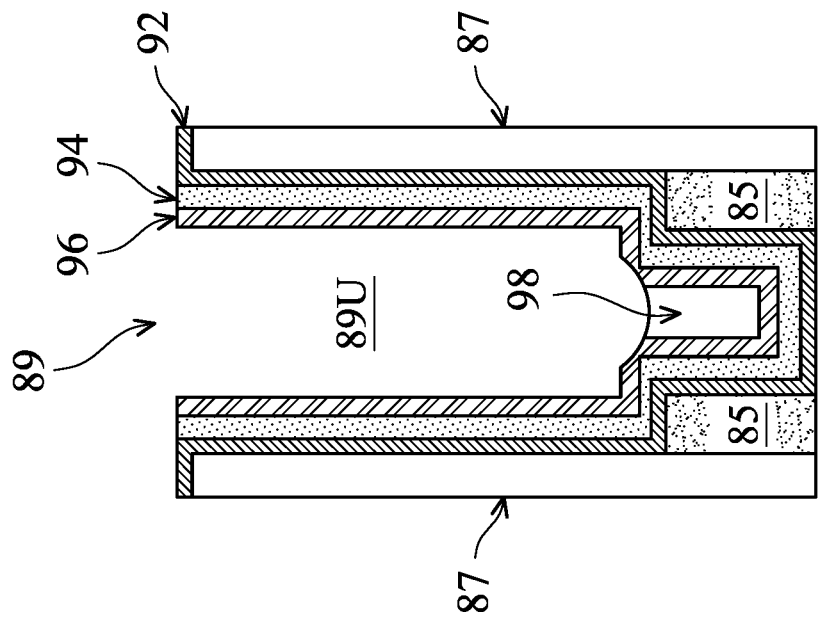

Referring next to FIG. 12, the glue layer 98 is removed from the upper trench 89U of the gate trench 89 by a glue layer pull-back process. In some embodiments, a wet etch process is performed as the glue layer pull-back process to selectively remove the glue layer 98 from the upper trench 89U without attacking (e.g., damaging, removing) the underlying layer (e.g., the capping layer 96). The wet etch process is performed using a chemical comprising an acid and an oxidizer, in some embodiments. For example, the chemical used may be a mixture of hydrochloric acid (HCl) and hydrogen peroxide ($H_2O_2$), where HCl functions as the acid and $H_2O_2$ functions as the oxidizer. In some embodiments, a mixing ratio (e.g., volume ratio) between HCl and $H_2O_2$ is between about 1:1 and 1:20 for the wet etch process. The wet etch process may be performed at a temperature between about 40° C. and about 70° C. for a duration between about 1 minute and about 5 minutes. As illustrated in FIG. 12, after the glue layer pull-back process, the capping layer 96 is exposed in the upper trench 89U, and a remaining portion of the glue layer 98 still fills the lower trench 89L.

Figure 13:
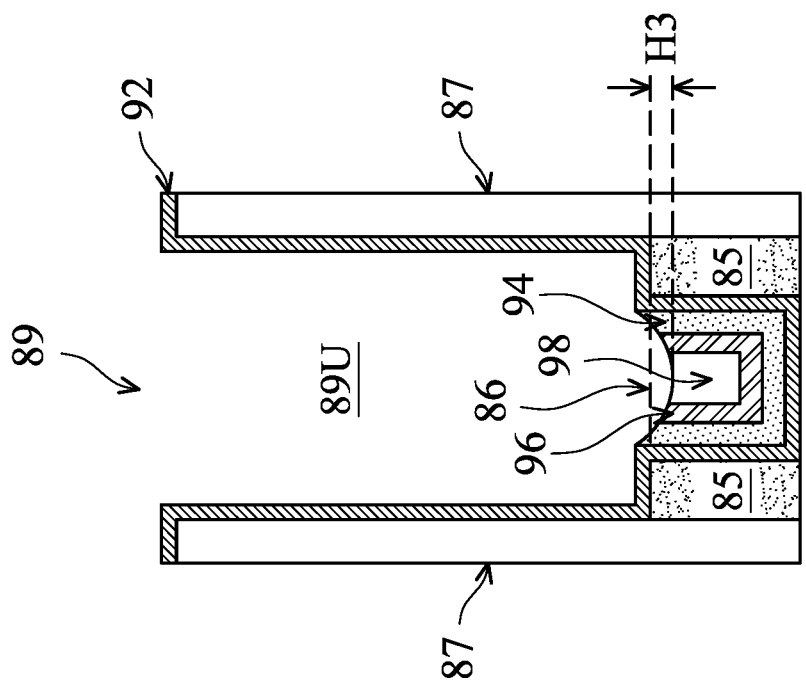

Next, in FIG. 13, the capping layer 96 is removed from the upper trench 89U by a capping layer break-through process. In some embodiments, a wet etch process is performed as the capping layer break-through process to remove the capping layer 96 from the upper trench 89U. In some embodiments, the wet etch process to remove the capping layer 96 from the upper trench 89U is performed using a fluoride-containing chemical. For example, the fluoride-containing chemical may be a mixture of hydrofluoric acid (HF) and water (e.g., $H_2O$, or de-ionized water (DIW)). In some embodiments, a mixing ratio (e.g., volume ratio) between HF and $H_2O$ is between about 1:100 and 1:2000 for the wet etch process. The wet etch process may be performed at a temperature between about 20° C. and about 40° C. for a duration between about 3 minutes and about 6 minutes. As illustrated in FIG. 13, after the capping layer break-through process, the work function layer 94 is exposed in the upper trench 89U. In some embodiments, the etching selectivity of the fluoride-containing chemical may not be high, and therefore, the wet etch process (the capping layer break-through process) is performed in a time mode. In other words, the wet etch process is timed (e.g., performed for a pre-determined period of time) so that the capping layer 96 in the upper trench is completely removed without substantially attacking the work function layer 94 and/or the gate dielectric layer 92. As illustrated in FIG. 13, the capping layer break-through process also recesses portions of the layers 94/96/98 in the lower trench, such that the layers 94/96/98 in the lower trench has a curved (e.g., concave) upper surface that extends below the interface 86 between the upper trench 89U and the lower trench 89L.

Figure 14:
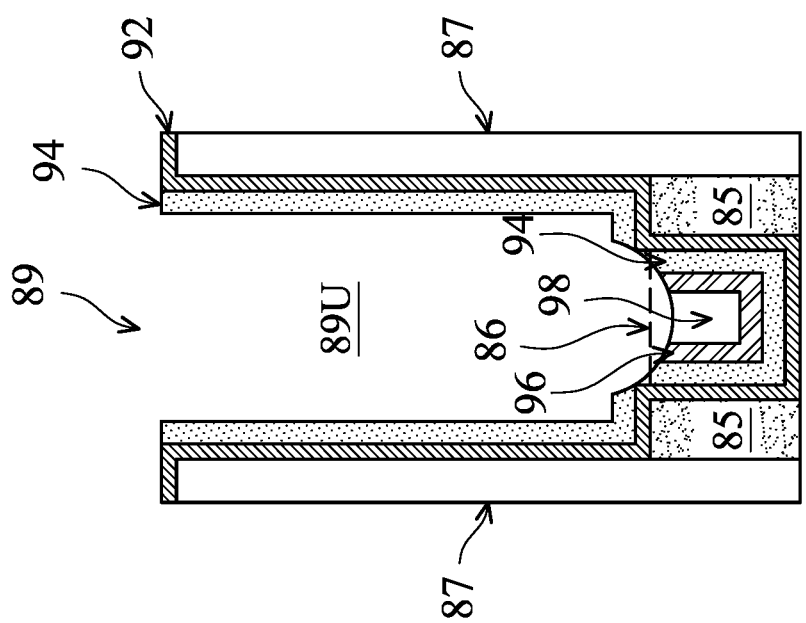

Next, in FIG. 14, the work function layer 94 is removed from the upper trench 89U. In some embodiments, a wet etch process is performed to selectively remove the work function layer 94 from the upper trench 89U without attacking the underlying gate dielectric layer 92. The wet etch process is performed using a chemical comprising a base and an oxidizer, in some embodiments. For example, the chemical used may be a mixture of ammonium hydroxide ($NH_4OH$) and hydrogen peroxide ($H_2O_2$), where $NH_4OH$ functions as the base and $H_2O_2$ functions as the oxidizer. In some embodiments, a mixing ratio (e.g., volume ratio) between $NH_4OH$ and $H_2O_2$ is between about 1:1 and 1:2001 for the wet etch process. The wet etch process may be performed at a temperature between about 40° C. and about 70° C. for a duration between about 1 minute and about 5 minutes. As illustrated in FIG. 14, after the wet etch process, the gate dielectric layer 92 is exposed in the upper trench 89U. FIG. 14 also illustrates a height H3 measured between a lowest position (e.g., closest to the substrate 50) of the curved upper surface of the layers 94/96/98 in the lower trench and the interface 86 between the upper trench 89U and the lower trench 89L, where H3 is between about 3 nm and about 12 nm, in some embodiments.

Figure 15:
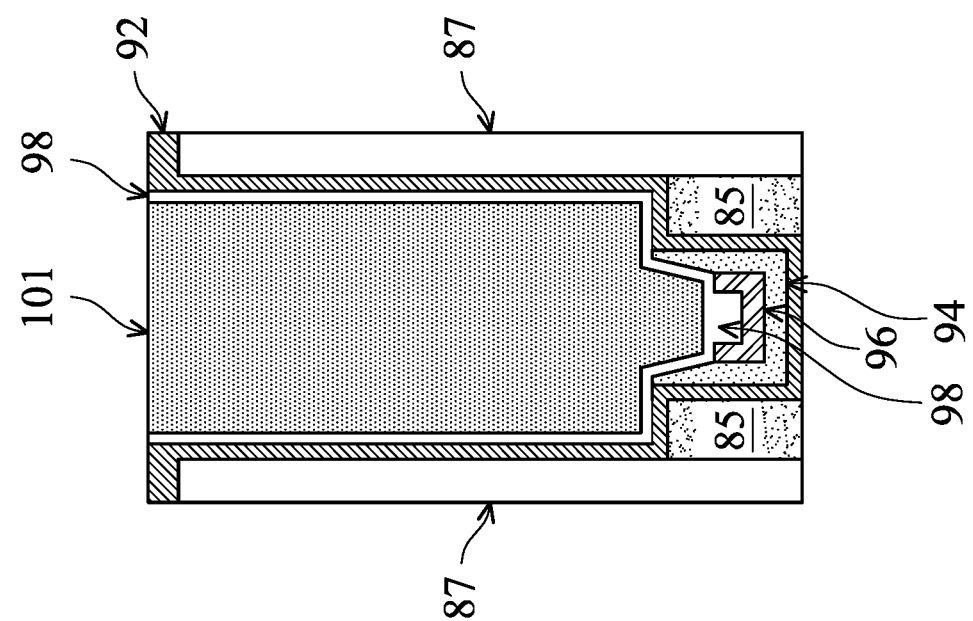

Next, in FIG. 15, the glue layer 98 is formed (e.g., conformally) again in the gate trenches 89, and a fill metal 101 (also referred to as a gate metal, or a gate electrode material) is formed to fill the remaining portion of the gate trench 89. As illustrated in FIG. 15, the glue layer 98 (e.g., TiN) is conformally formed along the gate dielectric layer 92 and along the curved upper surface of the layer 94/96/98 in the lower trench 89L. The newly formed glue layer 98 may merge with the remaining portion of the glue layer 98 in the lower trench 89L. After the glue layer 98 is formed, the fill metal 101 is formed to fill the gate trench 89. The fill metal 101 may be a suitable metal, such as tungsten (W), formed by a suitable method, such as PVD, CVD, electroplating, electroless plating, or the like. Besides tungsten, other suitable material, such as copper, gold, cobalt, combinations thereof, multi-layers thereof, alloys thereof, or the like, may also be used as the fill metal 101.

Figure 16:
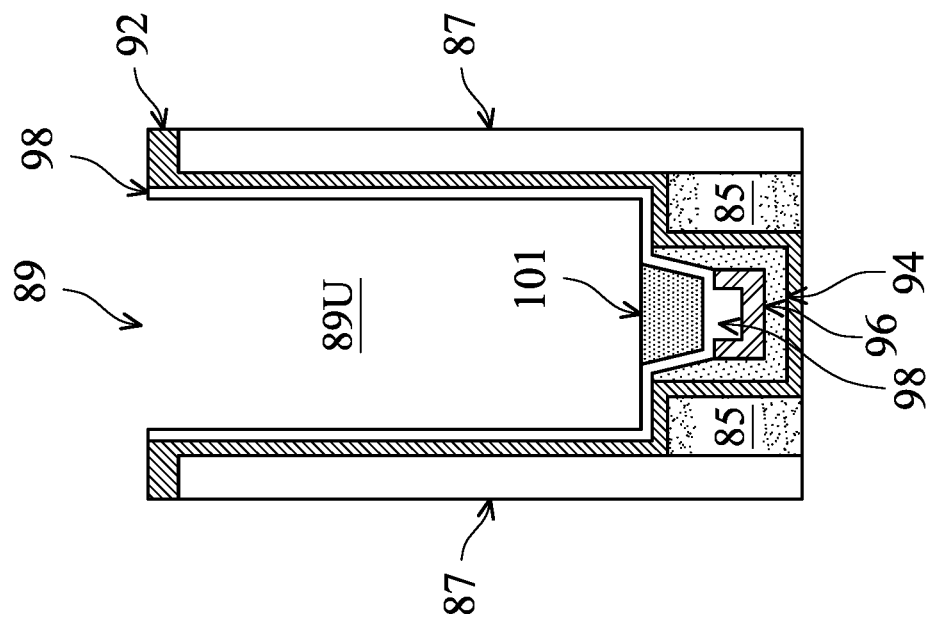

Next, in FIG. 16, the fill metal 101 is etched back (e.g., recessed) by a wet etch process, which selectively removes the fill metal 101 without substantially attacking the underlying glue layer 98. The wet etch process to etch back the fill metal 101 is performed using a chemical comprising an acid and an oxidizer, in some embodiments. For example, the chemical used may be a mixture of hydrochloric acid (HCl) and hydrogen peroxide ($H_2O_2$), where HCl functions as the acid and $H_2O_2$ functions as the oxidizer. In some embodiments, a mixing ratio (e.g., volume ratio) between HCl and $H_2O_2$ is between about 1:1 and 1:20 for the wet etch process. The wet etch process may be performed at a temperature between about 30° C. and about 70° C. for a duration between about 5 minutes and about 10 minutes. In some embodiments, a mixing ratio between HCl and $H_2O_2$ is adjusted to achieve a target etching selectivity between the fill metal 101 and the glue layer 98. For example, by adjusting the mixing ratio, the etching selectivity (e.g., a ratio of etching rates) between the fill metal 101 (e.g., W) and the glue layer 98 (e.g., TiN) is between about 20 and about 60. As illustrated in FIG. 16, after the wet etch process, a remaining portion of the fill metal 101 fills the lower trench 89L, and an upper surface of the remaining portion of the fill metal 101 is slightly above the upper surface of the first gate spacer 85.

Figure 17:
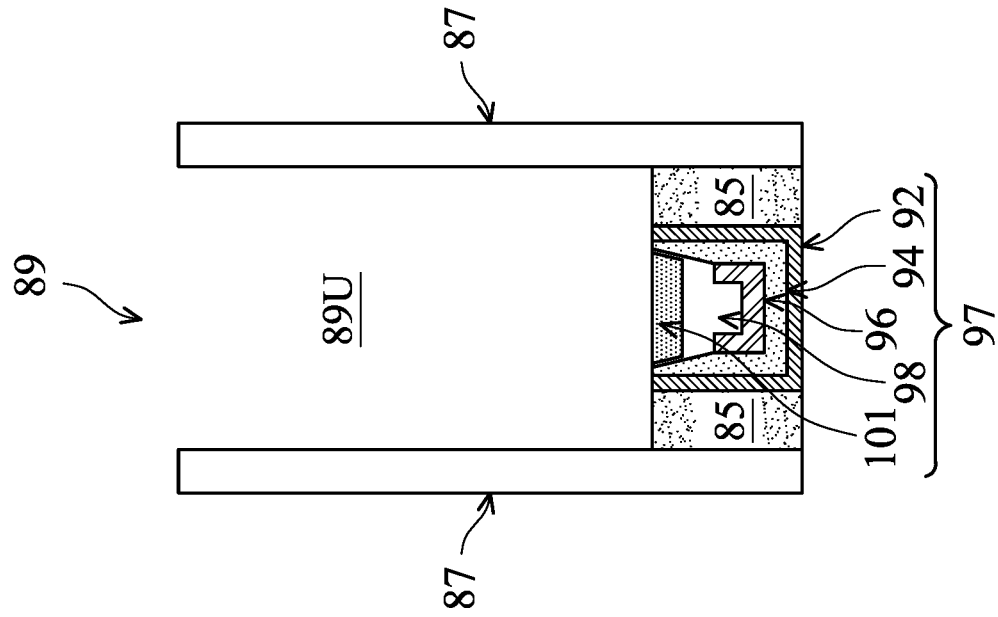

Next, in FIG. 17, a second glue layer pull-back process is performed to remove the glue layer 98 from the upper trench 89U. In some embodiments, a wet etch process is performed as the second glue layer pull-back process to selectively remove the glue layer 98 from the upper trench 89U without substantially attacking the fill metal 101. The wet etch process is performed using a chemical (e.g., an etchant) comprising a fluoride-containing chemical, an inhibitor, and an oxidizer, in some embodiments. For example, the fluoride-containing chemical may be ammonium fluoride ($NH_4F$), tetra-n-butylammonium fluoride (TBAF), or tetramethylammonium fluoride (TMAF). The inhibitor may be benzimidazole ($C_7H_6N_2$), tolyltriazole (TTA), or 5-Chloro-1H-benzotriazole. The inhibitor may protect the fill metal 101 from being etched by the wet etch process. The oxidizer may be a hydrogen peroxide ($H_2O_2$), nitric acid ($HNO_3$), or a mixture of both. In some embodiments, a mixing ratio (e.g., volume ratio) between the fluoride-containing chemical, the inhibitor, and the oxidizer are adjusted to achieve a target etching selectivity between the glue layer 98 and the fill metal 101. For example, an etching selectivity between about 20 and about 60 may be achieved to remove the glue layer 98 without substantially attacking the fill metal 101. In some embodiments, the wet etch process is performed at a temperature between about 30° C. and about 60° C. for a duration between about 1 minute and about 5 minutes. As illustrated in FIG. 17, after the wet etch process, the gate dielectric layer 92 is exposed in the upper trench 89U, and an upper surface of the remaining portion of the fill metal 101 is level with the upper surface of the first gate spacer 85, or level with the interface 86 between the upper trench 89U and the lower trench 89L.

Figure 18:
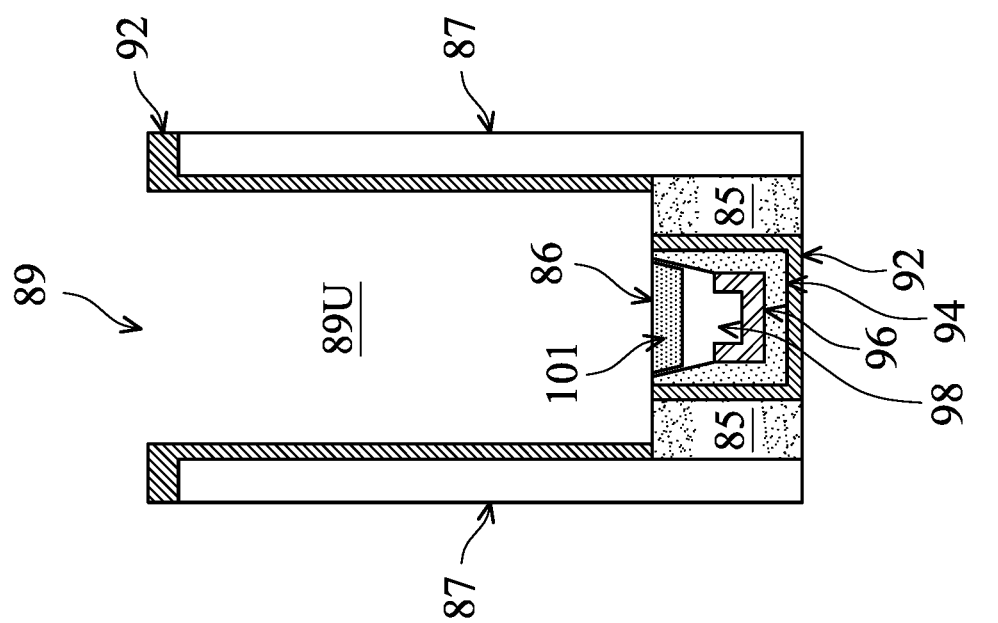

Next, in FIG. 18, portions of the gate dielectric layer 92 disposed in the upper trench 89U, e.g., along inner sidewalls of the second gate spacer 87, are removed. In some embodiments, a dry etch process is performed to remove the portions of the gate dielectric layer 92. The remaining portions of the fill metal 101 form a gate electrode 101. As illustrated in FIG. 18, the remaining portions of the various layers in the lower trench 89L, such as the gate dielectric layer 92, the work function layer 94, the capping layer 96, the glue layer 98, and the fill metal 101 form a metal gate 97.

In FIG. 18, the upper surface of the metal gate 97 is substantially level with the upper surface of the first gate spacer 85. The gate dielectric layer 92, the work function layer 94, and the capping layer 96 all have U-shaped cross-sections in FIG. 18. The glue layer 98 is vertically disposed between the gate electrode 101 and the capping layer 96, with a lower portion of the glue layer 98 extending into and filling a center region surrounded by the U-shaped capping layer 96. In addition, the glue layer 98 is horizontally disposed between two opposing inner sidewalls of the U-shaped work function layer 94.

Figure 19:
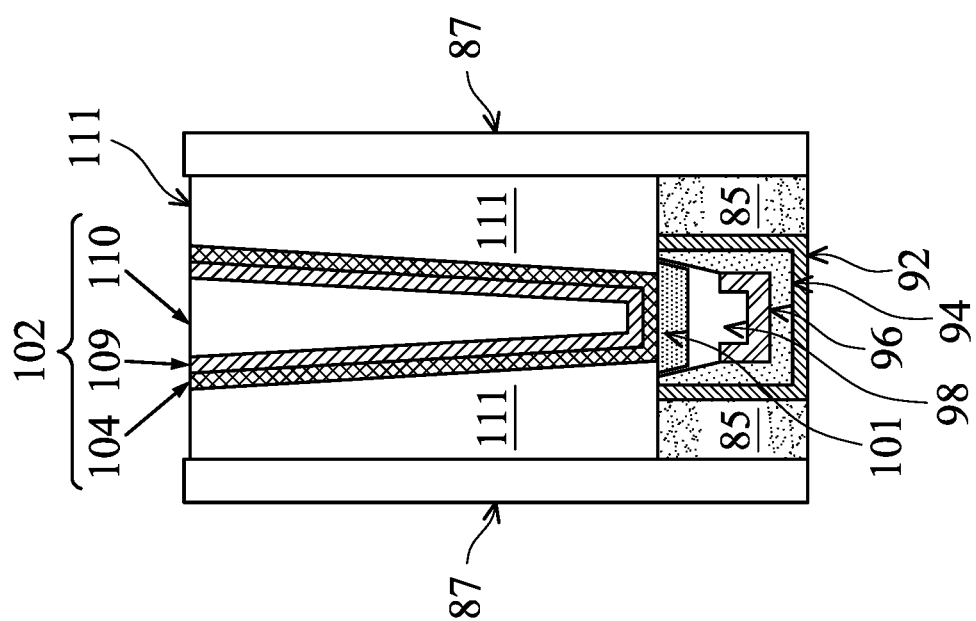

Next, in FIG. 19, semiconductor material 111, such as silicon, is formed in the gate trench 89, using a suitable formation method such as PVD, CVD, or the like. Next, a gate contact 102 is formed in the semiconductor material 111 to electrically couple to the gate electrode 101. To form the gate contact 102 (also referred to as contact plugs), a contact opening is formed in the semiconductor material 111 to expose the gate electrode 101, using, e.g., photolithography and etching. Once the contact opening is formed, a barrier layer 104, a seed layer 109, and a fill metal 110 are formed successively in the contact opening to form the gate contact 102.

In some embodiment, the barrier layer 104 comprises an electrically conductive material such as titanium nitride, although other materials, such as tantalum nitride, titanium, tantalum, or the like, may alternatively be utilized. The barrier layer 104 may be formed using a CVD process, such as PECVD. However, other alternative processes, such as sputtering, metal organic chemical vapor deposition (MOCVD), or ALD, may alternatively be used.

Next, the seed layer 109 is formed over the barrier layer 104. The seed layer 109 may include copper, titanium, tantalum, titanium nitride, tantalum nitride, the like, or a combination thereof, and may be deposited by ALD, sputtering, PVD, or the like. In some embodiments, the seed layer is a metal layer, which may be a single layer or a composite layer comprising a plurality of sub-layers formed of different materials. For example, the seed layer 109 may comprise a titanium layer and a copper layer over the titanium layer.

Next, the fill metal 110 is deposited over the seed layer 109, and fills the remaining portions of the contact opening. The fill metal 110 may be a metal-containing material such as Cu, Al, W, the like, combinations thereof, or multi-layers thereof, and may be formed by, e.g., electroplating, electroless plating, or other suitable method. After the formation of the fill metal 110, a planarization process, such as a CMP, may be performed to remove the excess portions of the barrier layer 104, the seed layer 109, and the fill metal 110, which excess portions are over the upper surface of the dielectric layer 91 (see FIG. 21) and over the upper surface of the second gate spacer 87. The resulting remaining portions of the barrier layer 104, the seed layer 109, and the fill metal 110 thus form the gate contact 102.

Figure 20:
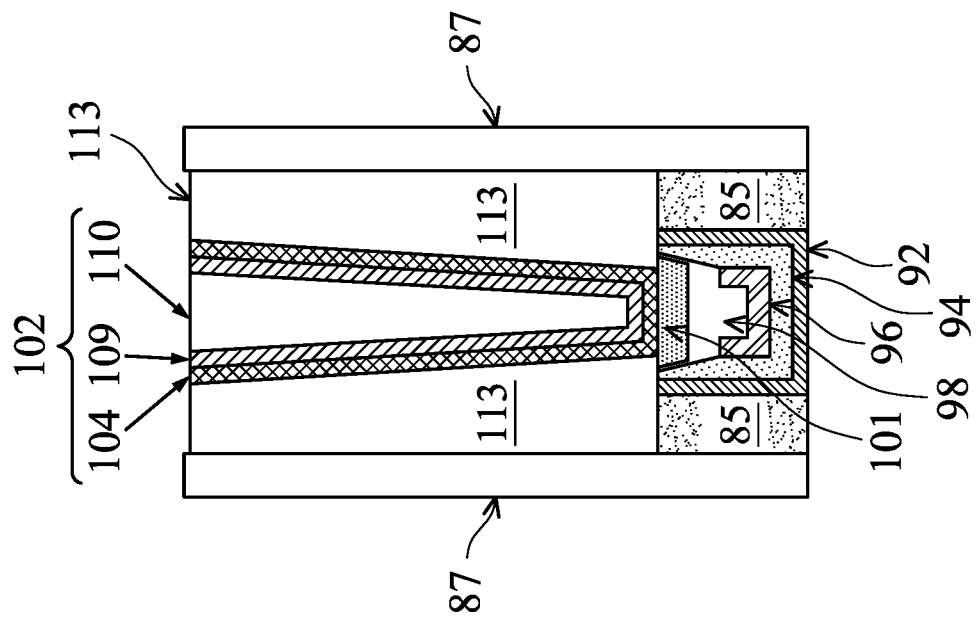

Next, in FIG. 20, the semiconductor material 111 is replaced with a dielectric material 113. The semiconductor material 111 may be removed by an etching process using an etchant that is selective to the semiconductor material 111. After the semiconductor material 111 is removed, the dielectric material 113 (e.g., silicon oxide, silicon nitride, a low-K dielectric material, or the like) is formed to fill the space previously occupied by the semiconductor material 111.

Figure 21:
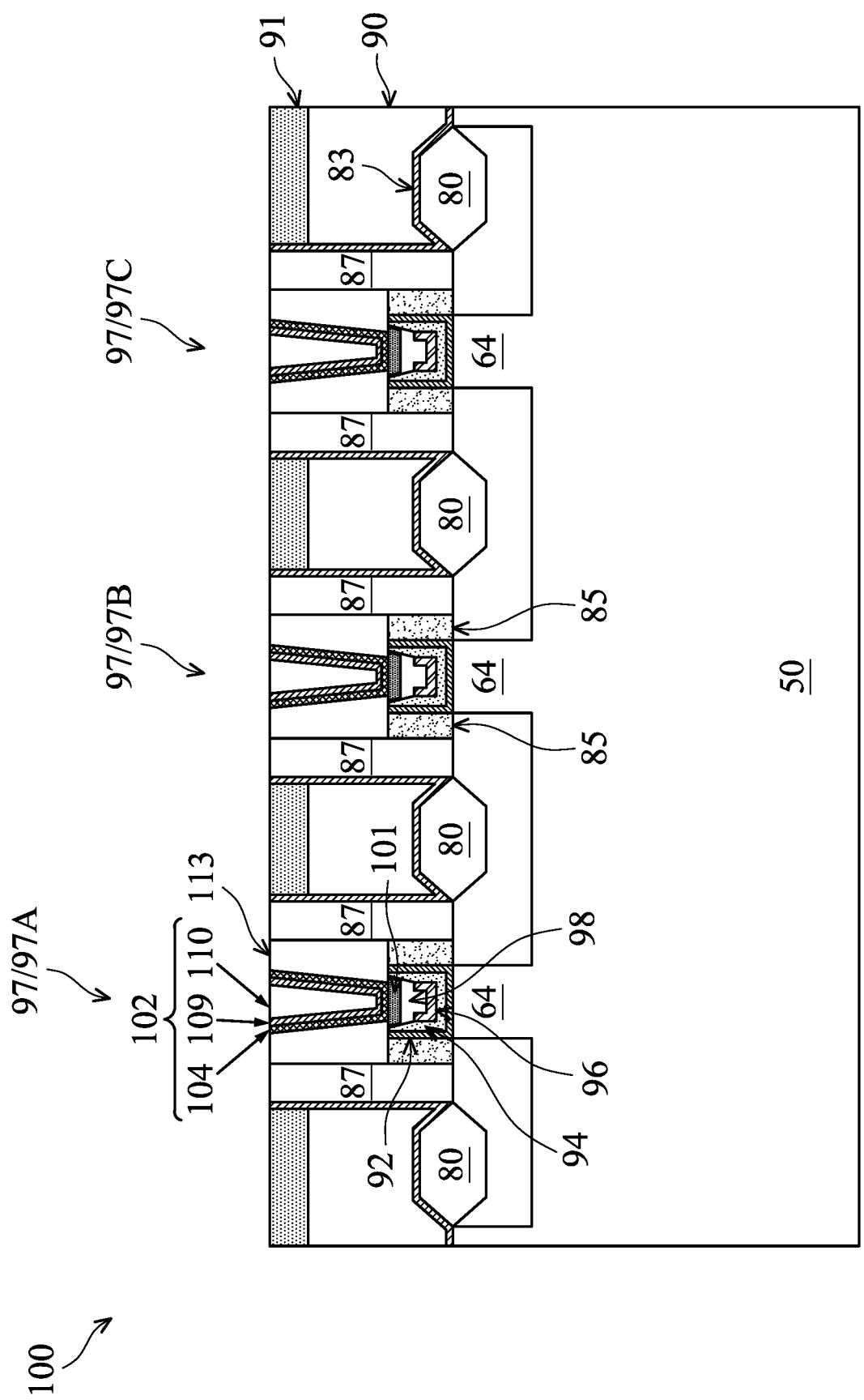

FIG. 21 shows the cross-sectional view of the FinFET device 100 after the dielectric material 113 replaces the semiconductor material 111. As illustrated in FIG. 21, metal gates 97A, 97B, and 97C, which replaced the dummy gate structure 75A, 75B, and 75C, respectively, are formed over the fin 64. One skilled in the art will appreciate that additional processing may be performed to finish the fabrication of the FinFET device 100, such as forming source/drain contacts and forming metallization layers over the dielectric layer 91. For brevity, details are not discussed herein.

As semiconductor manufacturing process continues to advance, the distance (e.g., pitch) between adjacent metal gates 97 are getting closer and closer. For advanced processing nodes such as 5 nm or beyond, the small pitch between metal gates 97 may cause metal gate leakage, which decreases the reliability of the device formed. Compared with a reference design where metal gates 97 are formed between the second gate spacers 87 (e.g., with the first gate spacers 85 completely removed and the metal gate 97 filling the space between the second gate spacers 87), the current disclosure, by forming the metal gates 97 between the recessed first gate spacers 85, increases the pitch between metal gates 97, thereby reducing the metal gate leakage and increasing device reliability. The increased pitch between adjacent metal gates 97 may also increase the pitch between adjacent gate contacts 102, which in combination with the fact that the gate contact 102 is surrounded by the second gate spacers 87, prevent or reduces the likelihood of electrical short between adjacent gate contacts 102.

In the example of FIG. 21, all of the metal gates 97 have a same structure (e.g., same film scheme in the metal gates). In other embodiments, the metal gates 97 may have different structures. For example, each of the metal gates 97 may have different work function layer(s) to achieve different threshold voltages, and/or to form metal gates in different regions (e.g. N-type device region or P-type device region) of the FinFET device 100. An example is illustrated in FIG. 22.

Figure 22:
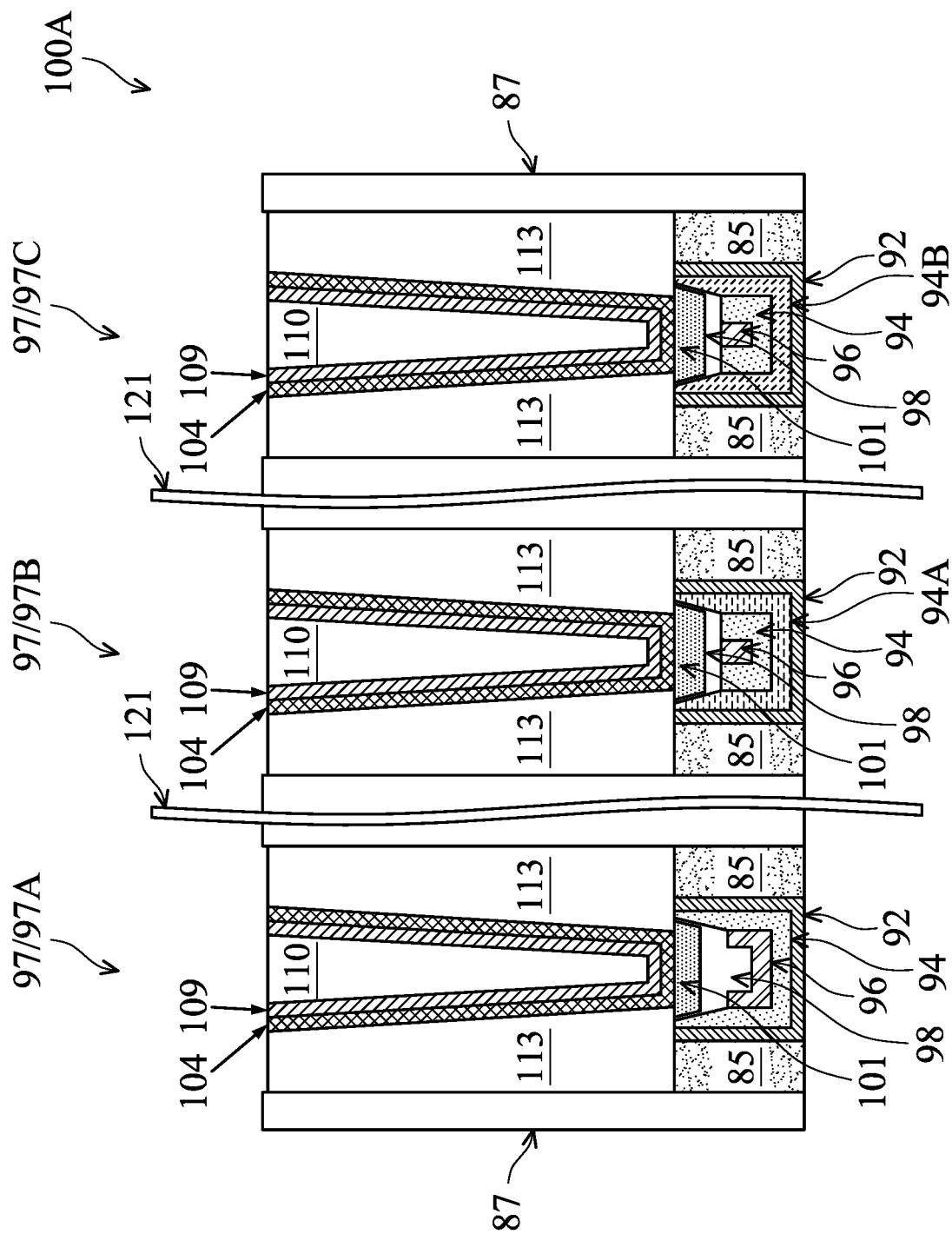
FIG. 22 illustrates a cross-sectional view of a FinFET device, in accordance with an embodiment.

FIG. 22 illustrates a cross-sectional view of portions of a FinFET device 100A, in an embodiment. The FinFET device 100A is similar to the FinFET device 100 of FIG. 21, but with different work function layer(s) for each metal gate. For simplicity, FIG. 22 only illustrates portions of the FinFET device 100A adjacent to the metal gates 97A, 97B, and 97C, such as portions in the regions 88 (see FIG. 10) of the FinFET device 100A. The metal gates 97A, 97B, and 97C are separated by dividers 121, where the dividers 121 indicate additional features (see, e.g., FIG. 21) between the metal gates 97A, 97B, and 97C that are omitted for simplicity.

In FIG. 22, the metal gate 97A is the same as the metal gate 97A in FIG. 21, and has an N-type work function layer 94. The metal gate 97B has two work function layers. In particular, the metal gate 97B has a P-type work function layer 94A contacting (e.g., physically contacting) and extending along the gate dielectric layer 92, and has the N-type work function layer 94 contacting (e.g., physically contacting) and extending along the P-type work function layer 94A. Note that while the capping layer 96 of the metal gate 97A has a U-shaped cross-section, the capping layer 96 of the metal gate 97B has a rectangular shaped cross-section, which may due to the dual-work function layer structure of the metal gate 97B having less space available for the capping layer 96. Accordingly, while the glue layer 98 of the metal gate 97A has a lower portion protruding into a center region surrounded by the U-shaped capping layer 96, the glue layer 98 of the metal gate 97B is disposed over the rectangular shaped capping layer 96 and does not have such a lower portion. The metal gate 97C is similar to the metal gate 97B, but with a different P-type work function layer 94B.

The presently disclosure provides many advantages for forming FinFET devices having metal gates 97A, 97B, and 97C with different film schemes (e.g., different work function layers). Here the term film scheme refers to the materials and the structure of the stack of layers (e.g., 92, 94/94A/94B, 96, and 98) of the metal gate 97. To appreciate the advantages, consider a reference method where removal of the glue layer 98, the capping layer 96, and the work function layer 94/94A/94B from the upper trench 89U (see processing in FIGS. 12-14) is performed by a dry etch process, such as an anisotropic plasma etch process. Due to the different film schemes (e.g., different work function layers) of the metal gates in the gate trenches 89A, 89B, and 89C, the etch rates for the different combinations of layers in the gate trenches 89A, 89B, and 89C are different, which results in a loading effect (e.g., non-uniformity) in the removal of the layers in the gate trenches. In other words, the amount of removed layers in the gate trenches 89A, 89B, and 89C are different. This may result in the gate heights of the subsequently formed metal gates 97A, 97B, and 97C to be non-uniform. In addition, the dry etch process may damage the gate dielectric layer 92, the dielectric layer 91, and/or the ILD 90, and may change the critical dimension (CD) of the features formed (e.g., CD of the metal gates).

In contrast, the presently disclosed method uses wet etch processes to remove the glue layer 98, the capping layer 96, and the work function layer 94/94A/94B from the upper trench 89U. The end point of the wet etch processes can be precisely controlled by, e.g., using an etchant selective to the layer being removed. Loading effect is reduced or avoided by the wet etch processes. As a result, the subsequently formed metal gates 97A, 97B, and 97C have well-controlled, uniform gate heights. In addition, damage to the gate dielectric layer 92 is avoided, loss of the ILD 90 and/or the dielectric layer 91 is reduced, and the critical dimension of the metal gates is preserved.

Figure 23:
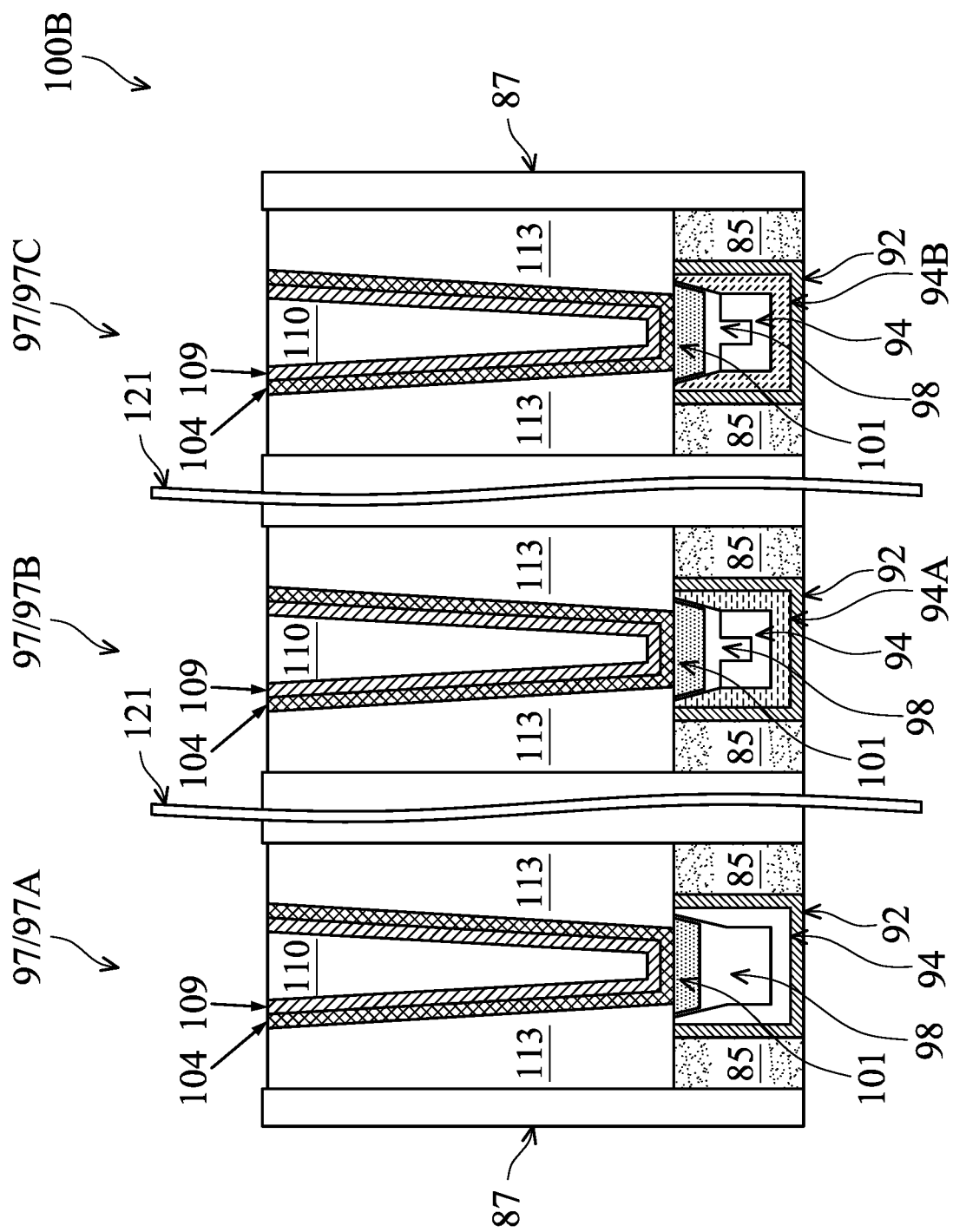
FIG. 23 illustrates a cross-sectional view of a FinFET device, in accordance with an embodiment.

FIG. 23 illustrates a cross-sectional view of portions of a FinFET device 100B, in an embodiment. The FinFET device 100B is similar to the FinFET device 100A of FIG. 22, but without the capping layer 96. In FIG. 23, the gate dielectric layer 92 and the work function layers (e.g., 94, 94A, 94B) all have U-shaped cross-sections. As a result, the glue layer 98 of the metal gate 97A is disposed in the center region of the U-shaped work function layer 94 (e.g., an N-type work function layer). The glue layer 98 of the metal gate 97B has an upper portion disposed over the U-shaped work function layer 94 (e.g., an N-type work function layer), and has a lower portion that protrudes into a center region surrounded by the U-shaped work function layer 94. In addition, the upper portion of the glue layer 98 of the metal gate 97B is disposed in a center region surrounded by the P-type work function layer 94A, and the gate electrode 101 is surrounded by the glue layer 98. The structure of the metal gate 97C is similar to that of the metal gate 97B, thus details are not repeated.

Variations or modifications to the disclosed embodiments are possible and are fully intended to be included within the scope of the present disclosure. For example, besides forming the metal gates of FinFET devices, the disclosed embodiments may be used for other metal gate exposure processes where precise control of the gate height is needed. In addition, conditions and/or parameters of the wet etch processes used for removing the various layers from the upper trench, such as the temperature, duration, and/or the chemical composition of the etchant, may be modified to fine tune the etch rates to achieve the target gate height. As another example, the disclosed embodiments may be used to control the height of metal island or metal gate.

Embodiments may achieve advantages. For example, the disclosed embodiments increase the pitch between adjacent metal gates, thereby reducing metal gate leakage and increasing the reliability of the device formed. The increased gate pitch also reduces the likelihood of electrical short between adjacent gate contacts. The use of wet etch processes to remove the various layers (e.g., 94, 96, 98) from the upper trench 89U reduces the loading effect, and helps to precisely control the gate heights of the metal gates formed. In addition, damage to the gate dielectric layer 92 and loss of the ILD 90/dielectric layer 91 are prevented or reduced. Furthermore, the critical dimension (CD) of the features formed (e.g., CD of the metal gates) is preserved.

Figure 24:
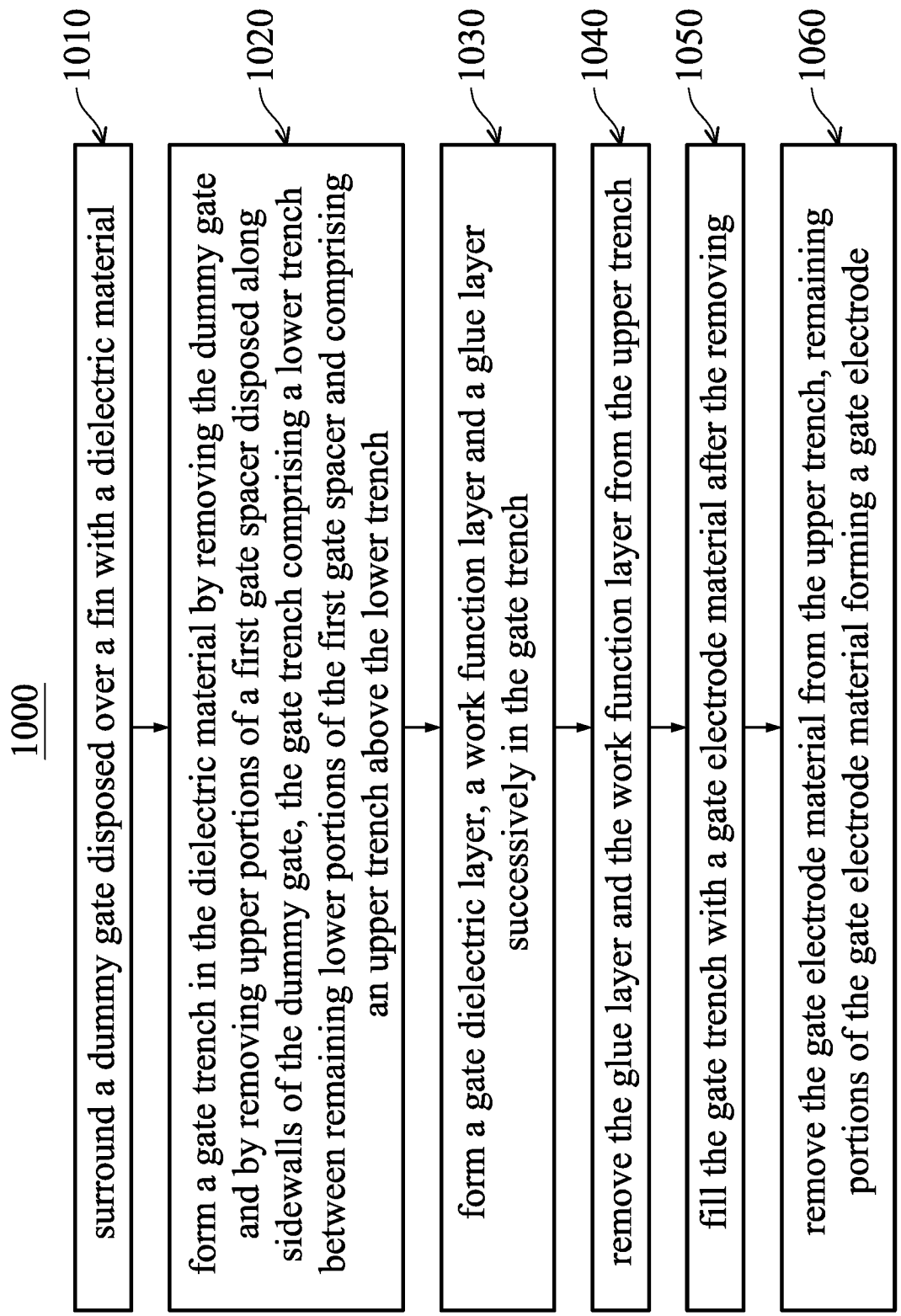
FIG. 24 illustrates a flow chart of method of making a semiconductor device, in accordance with some embodiments.

FIG. 24 illustrates a flow chart of a method of fabricating a semiconductor device, in accordance with some embodiments. It should be understood that the embodiment method shown in FIG. 24 is merely an example of many possible embodiment methods. One of ordinary skill in the art would recognize many variations, alternatives, and modifications. For example, various steps as illustrated in FIG. 24 may be added, removed, replaced, rearranged and repeated.

Referring to FIG. 24, at step 1010, a dummy gate disposed over a fin is surrounded with a dielectric material. At step 1020, a gate trench is formed in the dielectric material by removing the dummy gate and by removing upper portions of a first gate spacer disposed along sidewalls of the dummy gate, the gate trench comprising a lower trench between remaining lower portions of the first gate spacer and comprising an upper trench above the lower trench. At step 1030, a gate dielectric layer, a work function layer and a glue layer are formed successively in the gate trench. At step 1040, the glue layer and the work function layer are removed from the upper trench. At step 1050, the gate trench is filled with a gate electrode material after the removing. At step 1060, the gate electrode material is removed from the upper trench, remaining portions of the gate electrode material forming a gate electrode.

In an embodiment, a method of forming a semiconductor device includes: surrounding a dummy gate disposed over a fin with a dielectric material; forming a gate trench in the dielectric material by removing the dummy gate and by removing upper portions of a first gate spacer disposed along sidewalls of the dummy gate, the gate trench comprising a lower trench between remaining lower portions of the first gate spacer and comprising an upper trench above the lower trench; forming a gate dielectric layer, a work function layer and a glue layer successively in the gate trench; removing the glue layer and the work function layer from the upper trench; filling the gate trench with a gate electrode material after the removing; and removing the gate electrode material from the upper trench, remaining portions of the gate electrode material forming a gate electrode. In an embodiment, after removing the glue layer and the work function layer, remaining portions of the glue layer and remaining portions of the work function layer have a curved upper surface extending below an interface between the upper trench and the lower trench. In an embodiment, forming the gate trench includes: performing one or more etching processes to remove the dummy gate; and after the dummy gate is removed, performing another etching process to remove the upper portions of the first gate spacer. In an embodiment, a second gate spacer surrounds the first gate spacer, wherein after removing the upper portions of the first gate spacer, sidewalls of the second gate spacer above the remaining lower portions of the first gate spacer define the upper trench. In an embodiment, the upper trench is wider than the lower trench. In an embodiment, removing the glue layer and the work function layer from the upper trench includes: performing a first etching process to selectively remove the glue layer from the upper trench; and after the first etching process, performing a second etching process to selectively remove the work function layer from the upper trench. In an embodiment, the method further includes: forming a silicon-containing capping layer between the work function layer and the glue layer; and removing the silicon-containing capping layer from the upper trench before filling the gate trench with the gate electrode material. In an embodiment, removing the silicon-containing capping layer comprises performing a third etching process after the first etching process and before the second etching process, the third etching process removing portions of the silicon-containing capping layer, portions of the glue layer, and portions of the work function layer. In an embodiment, removing the glue layer and the work function layer from the upper trench exposes upper portions of the gate dielectric layer disposed in the upper trench, wherein the method further comprises: after removing the glue layer and the work function layer from the upper trench and before filling the gate trench, forming the glue layer for a second time in the gate trench and on the exposed upper portions of the gate dielectric layer. In an embodiment, removing the gate electrode material from the upper trench comprises performing a first wet etch process to selectively remove the gate electrode material, wherein removing the gate electrode material from the upper trench exposes upper portions of the glue layer disposed in the upper trench. In an embodiment, the method further includes: after removing the gate electrode material from the upper trench, performing a second wet etch process to selectively remove the upper portions of the glue layer disposed in the upper trench; and after the second wet etch process, performing a dry etch process to remove the upper portions of the gate dielectric layer disposed in the upper trench.

In an embodiment, a method of forming a semiconductor device includes: forming a gate trench in a dielectric material by removing a dummy gate and by removing an upper portion of a first gate spacer around the dummy gate, wherein the gate trench comprises a lower trench between a remaining lower portion of the first gate spacer and comprises an upper trench above the lower trench; lining sidewalls and a bottom of the gate trench by forming a gate dielectric layer, a work function layer, a capping layer, and a first glue layer successively in the gate trench; removing the first glue layer, the capping layer, and the work function layer from the upper trench; forming a second glue layer in the gate trench after removing the first glue layer, the capping layer, and the work function layer; filling the gate trench with a gate metal after forming the second glue layer; remove the gate metal from the upper trench, a remaining portion of the gate metal in the lower trench forming a gate electrode; and removing the second glue layer and the gate dielectric layer from the upper trench after removing the gate metal. In an embodiment, a first width of the upper trench is larger than a second width of the lower trench. In an embodiment, removing the first glue layer, the capping layer, and the work function layer from the upper trench comprises: performing a first wet etch process using a first mixture of an acid and a first oxidizer to selectively remove the first glue layer; after the first wet etch process, performing a second wet etch process using fluoride-containing chemical to remove the capping layer; and after the second wet etch process, performing a third wet etch process using a second mixture of a base and a second oxidizer to selectively remove the work function layer. In an embodiment, removing the second glue layer and the gate dielectric layer from the upper trench comprises: performing a wet etch process using a mixture of a fluoride-containing chemical, a metal inhibitor, and an oxidizer to selectively remove the second glue layer; and after the wet etch process, performing a dry etch process to remove the gate dielectric layer.

In an embodiment, a semiconductor device includes: a fin protruding above a substrate; a first metal gate over the fin; a first gate spacer extending along sidewalls of the first metal gate; a second gate spacer extending along sidewalls of the first gate spacer, an second upper surface of the second gate spacer distal from the substrate extending further from the substrate than a first upper surface of the first gate spacer distal from the substrate; a dielectric material surrounded by the second gate spacer and extending from the first upper surface of the first gate spacer to the second upper surface of the second gate spacer; and a first gate contact extending through the dielectric material and electrically coupled to the first metal gate. In an embodiment, the first upper surface the first gate spacer is substantially level with an upper surface of the first metal gate. In an embodiment, the first metal gate comprises a gate dielectric layer, wherein sidewalls of the first gate spacer contact the gate dielectric layer of the first metal gate, and sidewalls of the second gate spacer contact the sidewalls of the first gate spacer. In an embodiment, the first metal gate further comprises a work function layer over the gate dielectric layer, a silicon-containing capping layer over the work function layer, a glue layer over the silicon-containing capping layer, and a gate electrode over the glue layer. In an embodiment, the silicon-containing capping layer has a U-shaped cross-section.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a fin protruding above a substrate;
   a first gate structure over the fin;
   first gate spacers extending along sidewalls of the first gate structure; and
   second gate spacers extending along sidewalls of the first gate spacers, wherein the first gate spacers are between the first gate structure and the second gate spacers, wherein a second upper surface of the second gate spacers distal from the substrate extends further from the substrate than a first upper surface of the first gate spacers distal from the substrate, wherein the first gate structure comprises:
      a first gate dielectric material extending along an upper surface of the fin and inner sidewalls of the first gate spacers facing the first gate structure;
      a first work function layer over the first gate dielectric material;
      a first capping layer over and contacting the first work function layer, wherein the first capping layer has a U-shaped cross-section, wherein the first capping layer contacts and extends along lower sidewalls of the first work function layer;

a first glue layer over and contacting the first capping layer, wherein the first glue layer contacts and extends along upper sidewalls of the first work function layer; and
a first gate electrode embedded in the first glue layer.

2. The semiconductor device of claim 1, further comprising:
a dielectric material between the second gate spacers, wherein the dielectric material is disposed over the first gate spacers and the first gate structure, and extends along the first upper surface of the first gate spacers and an upper surface of the first gate structure; and
a first gate contact extending through the dielectric material and electrically coupled to the first gate structure.

3. The semiconductor device of claim 1, wherein the first upper surface of the first gate spacers is level with an upper surface of the first gate structure distal from the substrate.

4. The semiconductor device of claim 1, wherein the first capping layer has opposing sidewalls that face the first glue layer, wherein the first glue layer fills a space between the opposing sidewalls of the first capping layer.

5. The semiconductor device of claim 4, wherein the first glue layer contacts and extends along the opposing sidewalls of the first capping layer.

6. The semiconductor device of claim 5, wherein the first glue layer further contacts and extends along an upper surface of the first capping layer distal from the substrate.

7. The semiconductor device of claim 1, wherein the first gate electrode is separated from the first work function layer by the first glue layer.

8. The semiconductor device of claim 2, further comprising:
a second gate structure over the fin;
third gate spacers extending along sidewalls of the second gate structure;
fourth gate spacers extending along sidewalls of the third gate spacers, wherein the third gate spacers are between the second gate structure and the fourth gate spacers, wherein a fourth upper surface of the fourth gate spacers distal from the substrate extends further from the substrate than a third upper surface of the third gate spacers distal from the substrate;
the dielectric material between the fourth gate spacers and over the third gate spacers and the second gate structure; and
a second gate contact extending through the dielectric material and electrically coupled to the second gate structure.

9. The semiconductor device of claim 8, wherein the second gate structure comprises:
a second gate dielectric material extending along the upper surface of the fin and inner sidewalls of the third gate spacers facing the second gate structure;
a second work function layer over the second gate dielectric material;
a third work function layer over and contacting the second work function layer, wherein the third work function layer has a U-shaped cross-section, wherein the third work function layer contacts and extends along lower sidewalls of the second work function layer;
a second capping layer filling a region between opposing sidewalls of the third work function layer, wherein the second capping layer has a rectangular shaped cross-section;
a second glue layer over the second capping layer and the third work function layer, wherein the second glue layer contacts and extends along upper sidewalls of the second work function layer; and
a second gate electrode embedded in the second glue layer.

10. The semiconductor device of claim 9, wherein an upper surface of the second capping layer distal from the substrate is level with an upper surface of the third work function layer.

11. The semiconductor device of claim 10, wherein the second glue layer contacts and extends along the upper surface of the second capping layer and the upper surface of the third work function layer.

12. A semiconductor device comprising:
a fin protruding above a substrate;
a first gate structure over the fin;
first gate spacers along sidewalls of the first gate structure; and
second gate spacers along exterior sidewalls of the first gate spacers facing away from the first gate structure, wherein the second gate spacers extend further from the substrate than the first gate spacers, wherein the first gate structure comprises:
a first gate dielectric material along an upper surface of the fin and inner sidewalls of the first gate spacers facing the first gate structure;
a first work function layer over the first gate dielectric material;
a second work function layer over and contacting the first work function layer, wherein the second work function layer has a U-shaped cross-section, wherein the second work function layer contacts and extends along lower portions of sidewalls of the first work function layer;
a first capping layer filling a region between opposing sidewalls of the second work function layer;
a first glue layer over and contacting the first capping layer and the second work function layer, wherein the first glue layer contacts and extends along upper portions of the sidewalls of the first work function layer; and
a first gate electrode embedded in the first glue layer.

13. The semiconductor device of claim 12, further comprising:
a dielectric material between the second gate spacers over the first gate spacers and the first gate structure; and
a first gate contact extending through the dielectric material and electrically coupled to the first gate structure.

14. The semiconductor device of claim 12, wherein a first upper surface of the first gate spacers distal from the substrate is at a same distance from the substrate as an upper surface of the first gate structure distal from the substrate.

15. The semiconductor device of claim 13, further comprising:
a second gate structure over the fin;
third gate spacers along the second gate structure, wherein a third upper surface of the third gate spacers distal from the substrate is level with an upper surface of the second gate structure;
fourth gate spacers along exterior sidewalls of the third gate spacers, wherein the third gate spacers are between the second gate structure and the fourth gate spacers, wherein the fourth gate spacers extend further from the substrate than the third gate spacers;
the dielectric material between the fourth gate spacers and over the third gate spacers and the second gate structure; and a second gate contact extending through the dielectric material and electrically coupled to the second gate structure.

16. The semiconductor device of claim 15, wherein the second gate structure comprises:
   a second gate dielectric material extending along the upper surface of the fin and inner sidewalls of the third gate spacers facing the second gate structure;
   a third work function layer over the second gate dielectric material;
   a second capping layer over and contacting the third work function layer, wherein the second capping layer has a U-shaped cross-section, wherein the second capping layer contacts and extends along lower portions of the sidewalls of the third work function layer, wherein upper portions of the sidewalls of the third work function layer are exposed by the second capping layer;
   a second glue layer over and contacting the second capping layer, wherein the second glue layer contacts and extends along the upper portions of the sidewalls of the third work function layer, wherein the second glue layer fills a region between opposing sidewalls of the second capping layer; and
   a second gate electrode embedded in the second glue layer.

17. The semiconductor device of claim 12, wherein the first capping layer has a rectangular shaped cross-section, wherein an upper surface of the first capping layer distal from the substrate is level with an upper surface of the second work function layer, wherein the first glue layer contacts and extends along the upper surface of the first capping layer and the upper surface of the second work function layer.

18. A semiconductor device comprising:
   a fin protruding above a substrate;
   a first gate structure over the fin; and
   first plurality of gate spacers along sidewalls of the first gate structure, wherein the first plurality of gate spacers includes first gate spacers contacting the first gate structure, and second gate spacers contacting the first gate spacers, wherein the second gate spacers extend further from the substrate than the first gate spacers,
   wherein the first gate structure comprises:
     a first gate dielectric material along an upper surface of the fin and inner sidewalls of the first gate spacers facing the first gate structure;
     a first work function layer over the first gate dielectric material;
     a second work function layer over and contacting the first work function layer, wherein the second work function layer has a U-shaped cross-section, wherein the second work function layer contacts and extends along lower portions of sidewalls of the first work function layer;
     a first glue layer over and contacting the second work function layer, wherein the first glue layer contacts and extends along upper portions of the sidewalls of the first work function layer, wherein the first glue layer fills a region between opposing sidewalls of the second work function layer; and
     a first gate electrode embedded in the first glue layer.

19. The semiconductor device of claim 18, wherein the first glue layer further contacts and extends along an upper surface of the second work function layer distal from the substrate.

20. The semiconductor device of claim 19, further comprising:
   a second gate structure over the fin; and
   second plurality of gate spacers along sidewalls of the second gate structure, wherein the second plurality of gate spacers includes third gate spacers contacting the second gate structure, and fourth gate spacers contacting the third gate spacers, wherein the third gate spacers and the second gate structure have a coplanar upper surface distal from the substrate, wherein the fourth gate spacers extend further from the substrate than the third gate spacers,
   wherein the second gate structure comprises:
     a second gate dielectric material along the upper surface of the fin and inner sidewalls of the third gate spacers facing the second gate structure;
     a third work function layer over the second gate dielectric material;
     a second glue layer over and contacting the third work function layer; and
     a second gate electrode embedded in the second glue layer.

* * * * *